United States Patent
Kim et al.

(10) Patent No.: US 11,088,208 B2
(45) Date of Patent: Aug. 10, 2021

(54) DISPLAY APPARATUS

(71) Applicant: LG Display Co., Ltd., Seoul (KR)

(72) Inventors: Daehee Kim, Paju-si (KR); JiYoung Park, Paju-si (KR); Hyeju Choi, Paju-si (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 16/600,440

(22) Filed: Oct. 11, 2019

(65) Prior Publication Data

US 2020/0161383 A1    May 21, 2020

(30) Foreign Application Priority Data

Nov. 19, 2018 (KR) .......................... 10-2018-0142227

(51) Int. Cl.
*H01L 29/08* (2006.01)
*H01L 35/24* (2006.01)
(Continued)

(52) U.S. Cl.
CPC ...... *H01L 27/3206* (2013.01); *G02B 27/0172* (2013.01); *H01L 27/3246* (2013.01);
(Continued)

(58) Field of Classification Search
CPC ............. H01L 27/3218; H01L 27/3216; H01L 51/5072; H01L 51/5056; H01L 27/3246; H01L 27/326; G09G 3/3208
See application file for complete search history.

(56) References Cited

U.S. PATENT DOCUMENTS

2017/0186971 A1*  6/2017  Kanamoto .......... H01L 51/0071
2018/0294440 A1* 10/2018  Ushikubo .......... H01L 27/3244
(Continued)

FOREIGN PATENT DOCUMENTS

KR   10-2017-0137977 A   12/2017

*Primary Examiner* — Ismail A Muse
(74) *Attorney, Agent, or Firm* — Polsinelli PC

(57) ABSTRACT

A display device comprises a substrate provided with a first subpixel area and a second subpixel area, a first electrode provided on the substrate, including a first sub electrode provided in the first subpixel area and a second sub electrode provided in the second subpixel area, an organic light emitting layer including a first organic light emitting layer arranged on the first sub electrode and a second organic light emitting layer arranged on the second sub electrode, and a second electrode arranged on the organic light emitting layer, wherein the first organic light emitting layer includes a first pattern layer, a second pattern layer provided on the first pattern layer and a third pattern layer provided on the second pattern layer, the second organic light emitting layer includes a first pattern layer, a second pattern layer provided on the first pattern layer and a third pattern layer provided on the second pattern layer, the first pattern layer of the first organic light emitting layer is spaced apart from the first pattern layer of the second organic light emitting layer, the second pattern layer of the first organic light emitting layer is spaced apart from the second pattern layer of the second organic light emitting layer, and the third pattern layer of the first organic light emitting layer is connected with the third pattern layer of the second organic light emitting layer, and the second pattern layer of the first organic light emitting layer is provided to cover an upper surface and a side of the first pattern layer of the first organic light emitting layer. Therefore, a damage of the light emitting layer can be reduced.

14 Claims, 23 Drawing Sheets

(51) Int. Cl.
  *H01L 51/00*    (2006.01)
  *H01L 27/32*    (2006.01)
  *H01L 51/50*    (2006.01)
  *G02B 27/01*    (2006.01)

(52) U.S. Cl.
  CPC ...... *H01L 51/5036* (2013.01); *H01L 51/5056*
    (2013.01); *H01L 51/5072* (2013.01); *H01L*
    *51/5088* (2013.01); *H01L 51/5092* (2013.01);
    *H01L 51/5096* (2013.01)

(56)              References Cited

U.S. PATENT DOCUMENTS

2019/0189728 A1* 6/2019 Lee ................... H01L 51/5253
2020/0006445 A1* 1/2020 Hong ................. H01L 51/5072
2020/0212120 A1* 7/2020 Yang .................. H01L 27/3209

* cited by examiner

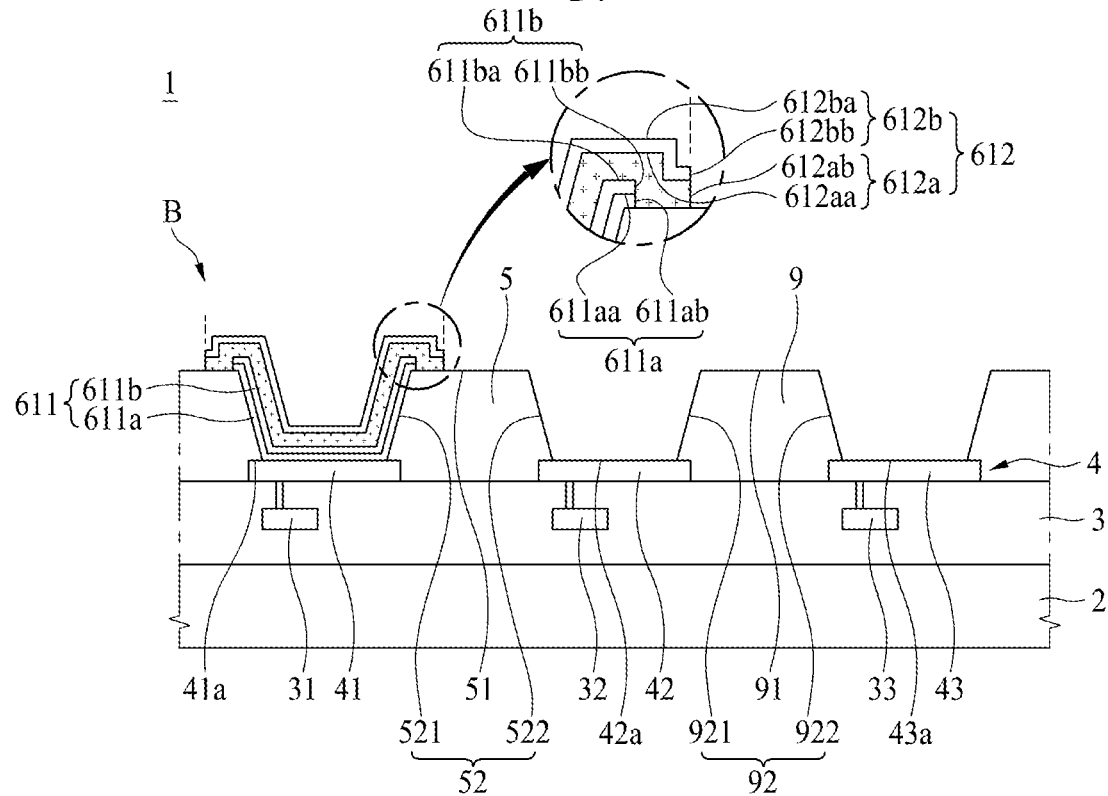
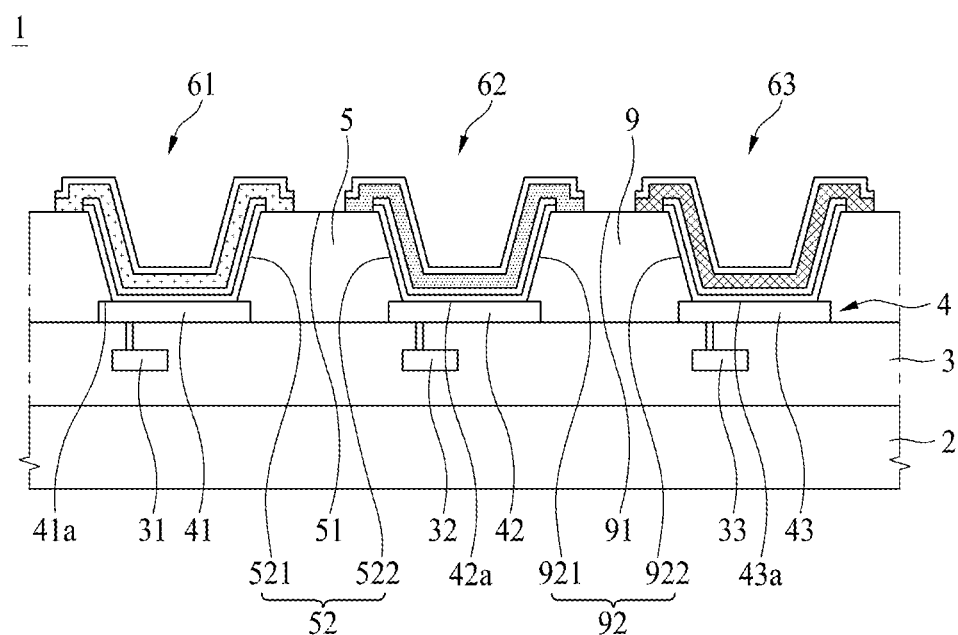

DISPLAY APPARATUS

CROSS REFERENCE TO RELATED APPLICATION

This application claims priority from Korean Patent Application No. 10-2018-0142227, filed on Nov. 19, 2018, which is hereby incorporated by reference in its entirety.

BACKGROUND

Field of the Disclosure

The present disclosure relates to a display device displaying an image.

Description of the Background

With the advancement of the information age, the demand for a display device for displaying an image has increased with various forms. Therefore, various types of display devices such as a liquid crystal display (LCD) device, a light emitting display device, an organic light emitting display device, a micro light emitting display device, and a quantum dot light emitting display (QLED) device have been recently used.

For an organic light emitting display device, in the case that FMM technology is used to form red, green and blue pixels of an organic light emitting layer, it is possible to manufacture a small-to-medium panel by a mask shadow but it is difficult to apply a large area to this panel for a problem of sagging of a deposition mask. A photographic process has a problem in that the organic light emitting layer is damaged due to an etching gas. This problem occurs more seriously in a display device, which requires ultra-high resolution, such as a head mounted display (HMD). Therefore, studies for a head mounted display with ultra-high resolution, which can prevent an organic light emitting layer from being damaged, have been actively ongoing.

SUMMARY

The present disclosure has been made in view of the above problems, and it is an object of the present disclosure to provide a display device that can prevent an organic light emitting layer from being damaged.

In accordance with an aspect of the present disclosure, the above and other objects can be accomplished by the provision of a display device comprising a substrate provided with a first subpixel area and a second subpixel area, a first electrode provided on the substrate, including a first sub electrode provided in the first subpixel area and a second sub electrode provided in the second subpixel area, an organic light emitting layer including a first organic light emitting layer arranged on the first sub electrode and a second organic light emitting layer arranged on the second sub electrode, and a second electrode arranged on the organic light emitting layer, wherein the first organic light emitting layer includes a first pattern layer, a second pattern layer provided on the first pattern layer and a third pattern layer provided on the second pattern layer, the second organic light emitting layer includes a first pattern layer, a second pattern layer provided on the first pattern layer and a third pattern layer provided on the second pattern layer, the first pattern layer of the first organic light emitting layer is spaced apart from the first pattern layer of the second organic light emitting layer, the second pattern layer of the first organic light emitting layer is spaced apart from the second pattern layer of the second organic light emitting layer, and the third pattern layer of the first organic light emitting layer is connected with the third pattern layer of the second organic light emitting layer, and the second pattern layer of the first organic light emitting layer is provided to cover an upper surface and a side of the first pattern layer of the first organic light emitting layer.

In accordance with another aspect of the present disclosure, the above and other objects can be accomplished by the provision of a display device comprising a substrate, a first electrode provided on the substrate, a bank provided to cover ends of the first electrode, an organic light emitting layer provided on the first electrode, and a second electrode arranged on the organic light emitting layer, wherein the organic light emitting layer includes a first pattern layer and a second pattern layer provided on the first pattern layer, and the second pattern layer is provided to cover an upper surface and a side of the first pattern layer.

In the display device according to the present disclosure, as the second pattern layer including a light emitting layer is formed separately from the first pattern layer to cover the first pattern layer, the time when the light emitting layer is exposed to an etching gas may be reduced, whereby a damage of the light emitting layer may be reduced to reduce a defect rate of the complete display device.

In addition to the effects of the present disclosure as mentioned above, additional objects and features of the present disclosure will be clearly understood by those skilled in the art from the following description of the present disclosure.

SCHEMATIC DESCRIPTION OF THE DRAWINGS

The above and other objects, features and other advantages of the present disclosure will be more clearly understood from the following detailed description taken in conjunction with the accompanying drawings, in which.

DETAILED DESCRIPTION

Figure 1:
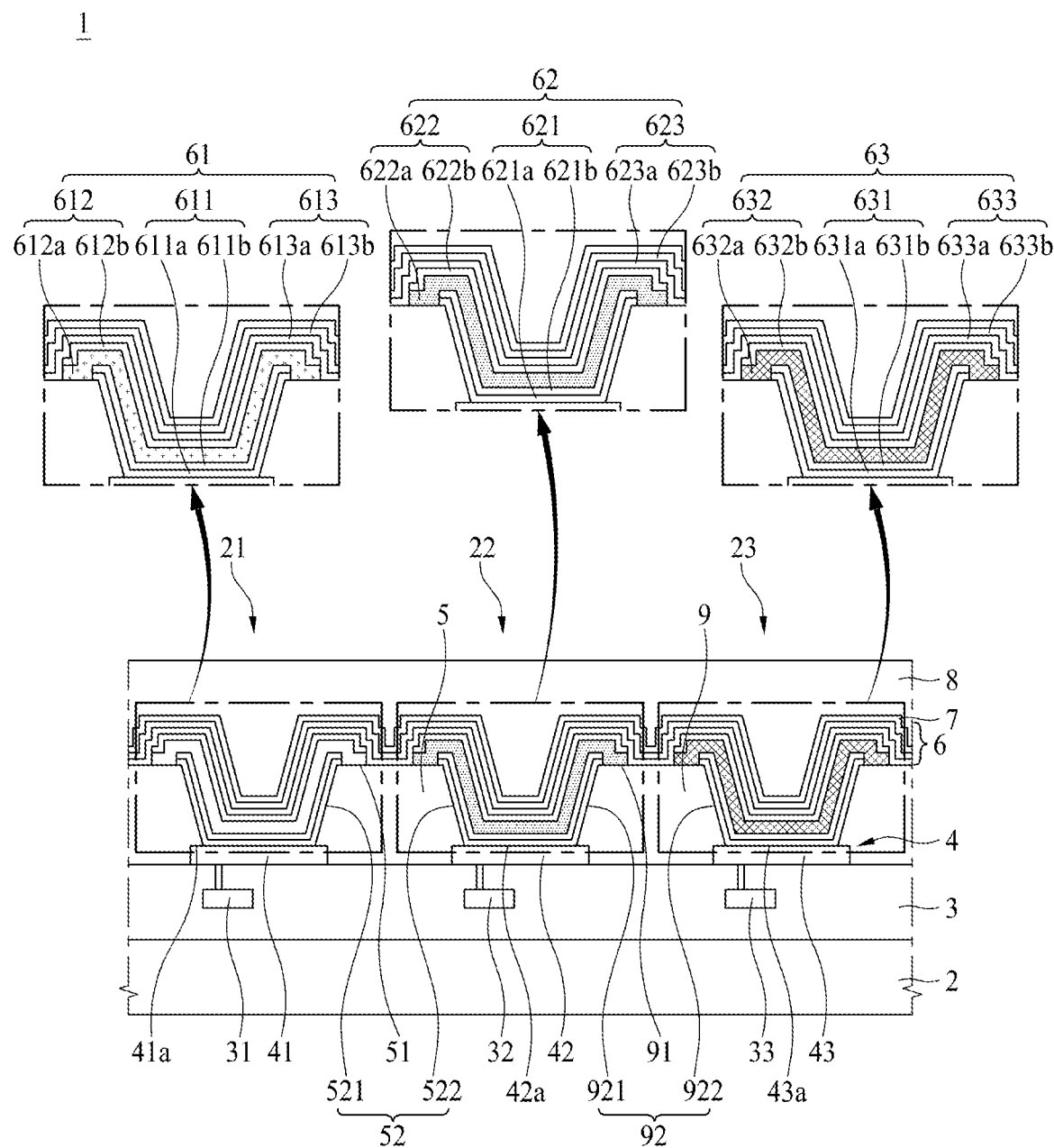
FIG. 1 is a schematic cross-sectional view illustrating a display device according to one aspect of the present disclosure.

Advantages and features of the present disclosure, and implementation methods thereof will be clarified through following aspects described with reference to the accompanying drawings. The present disclosure may, however, be embodied in different forms and should not be construed as limited to the aspects set forth herein. Rather, these aspects are provided so that this disclosure will be thorough and complete, and will fully convey the scope of the present disclosure to those skilled in the art. Further, the present disclosure is only defined by scopes of claims.

A shape, a size, a ratio, an angle, and a number disclosed in the drawings for describing aspects of the present disclosure are merely an example, and thus, the present disclosure is not limited to the illustrated details. Like reference numerals refer to like elements throughout the specification. In the following description, when the detailed description of the relevant known function or configuration is determined to unnecessarily obscure the important point of the present disclosure, the detailed description will be omitted. In a case where 'comprise', 'have', and 'include' described in the present specification are used, another part may be added unless 'only~' is used. The terms of a singular form may include plural forms unless referred to the contrary.

In construing an element, the element is construed as including an error range although there is no explicit description.

In describing a position relationship, for example, when the position relationship is described as 'upon~', 'above~', 'below~' and 'next to~', one or more other portions may be arranged between two portions unless 'just' or 'direct' is used.

It will be understood that, although the terms "first", "second", etc. may be used herein to describe various elements, these elements should not be limited by these terms. These terms are only used to partition one element from another. For example, a first element could be termed a second element, and, similarly, a second element could be termed a first element, without departing from the scope of the present disclosure.

In describing elements of the present disclosure, the terms "first", "second", etc. may be used. These terms are intended to identify the corresponding elements from the other elements, and basis, order, or number of the corresponding elements is not limited by these terms. The expression that an element is "connected" or "coupled" to another element should be understood that the element may directly be connected or coupled to another element but may indirectly be connected or coupled to another element unless specially mentioned, or a third element may be interposed between the corresponding elements.

Features of various aspects of the present disclosure may be partially or overall coupled to or combined with each other, and may be variously inter-operated with each other and driven technically as those skilled in the art can sufficiently understand. The aspects of the present disclosure may be carried out independently from each other, or may be carried out together in co-dependent relationship.

Hereinafter, the aspects of the display device according to the present disclosure will be described in detail with reference to the accompanying drawings. Wherever possible, the same reference numbers will be used throughout the drawings to refer to the same or like parts.

Figure 2A:
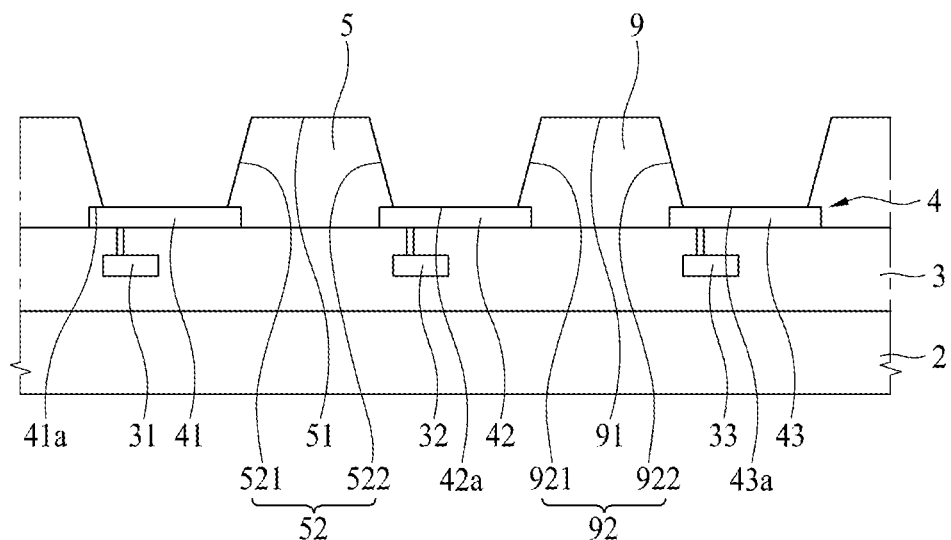
FIGS. 2A to 2O are schematic cross-sectional views illustrating a manufacturing process of a display device according to one aspect of the present disclosure.
Figure 2B:
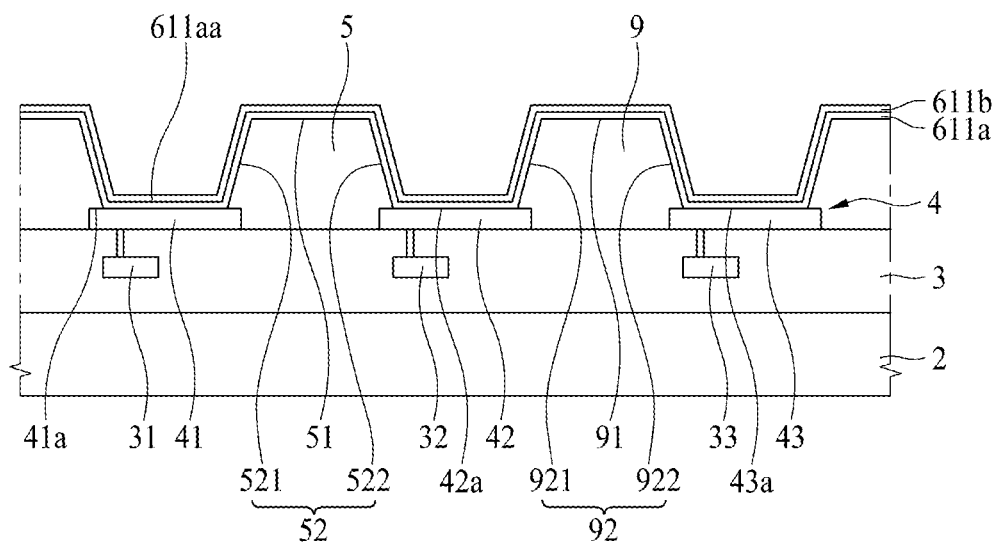
Figure 2C:
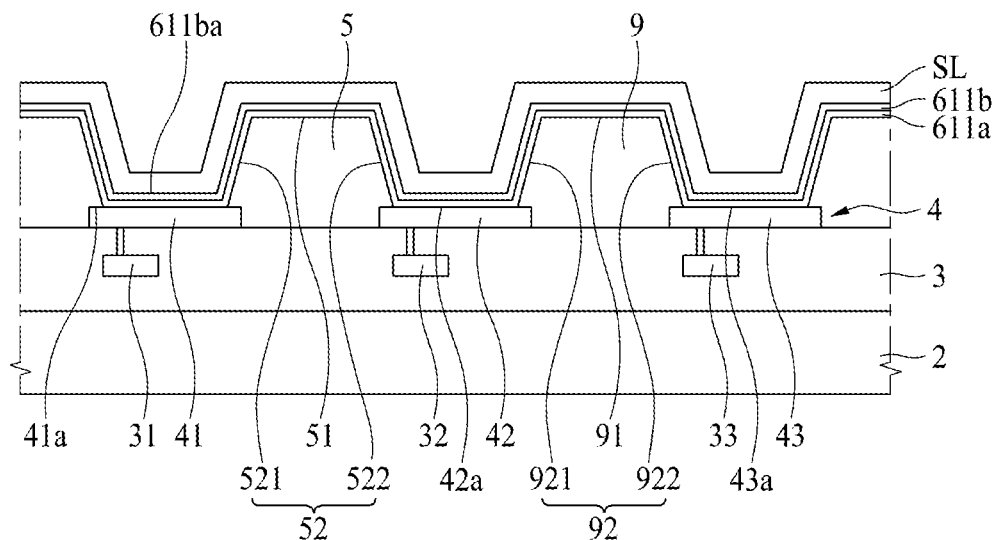
Figure 2D:
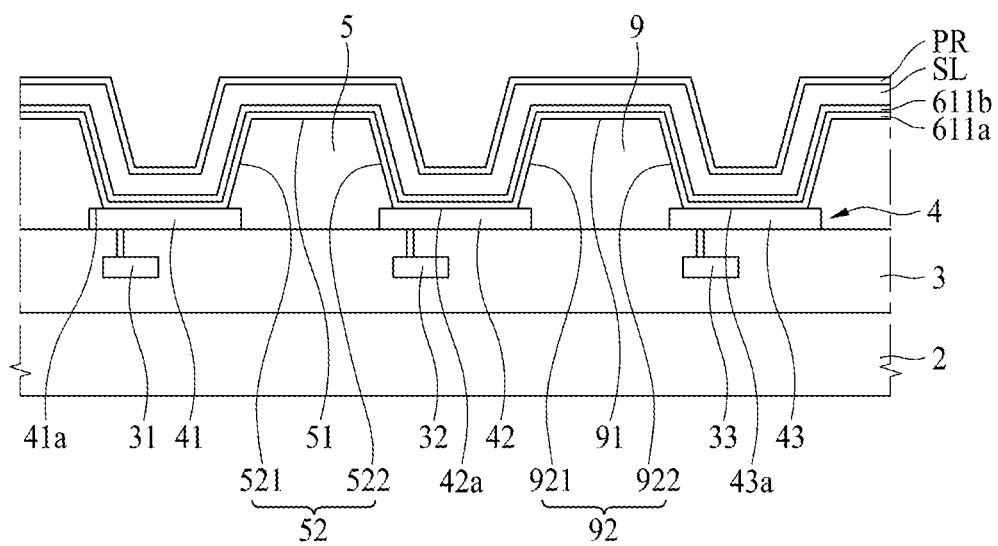
Figure 2E:
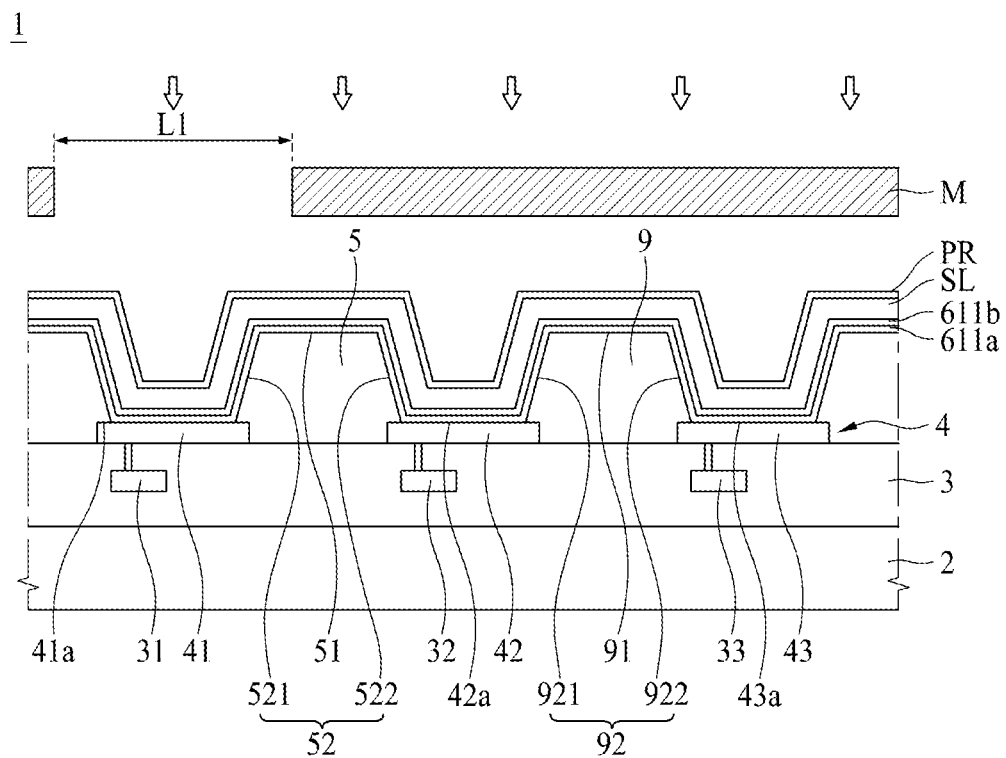
Figure 2F:
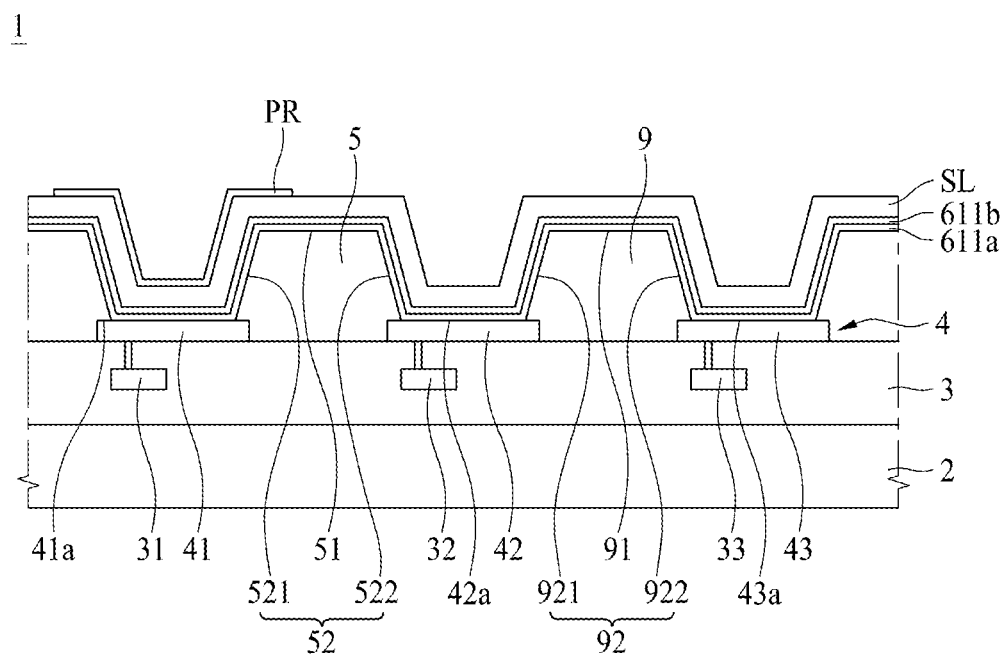
Figure 2G:
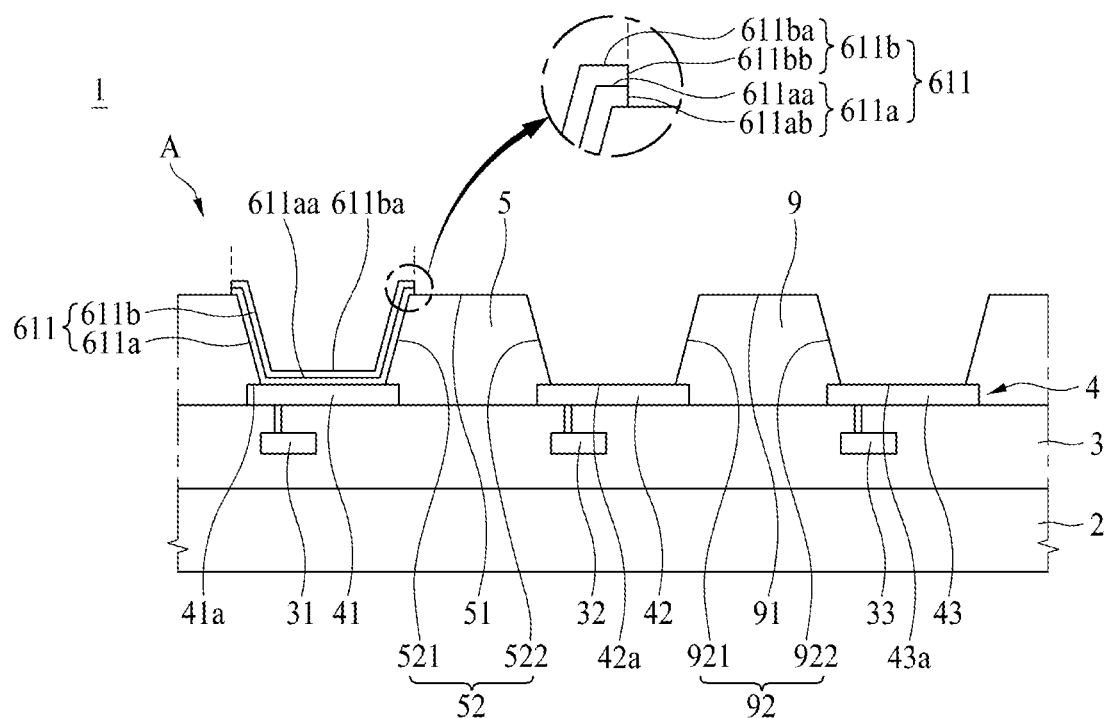
Figure 2H:
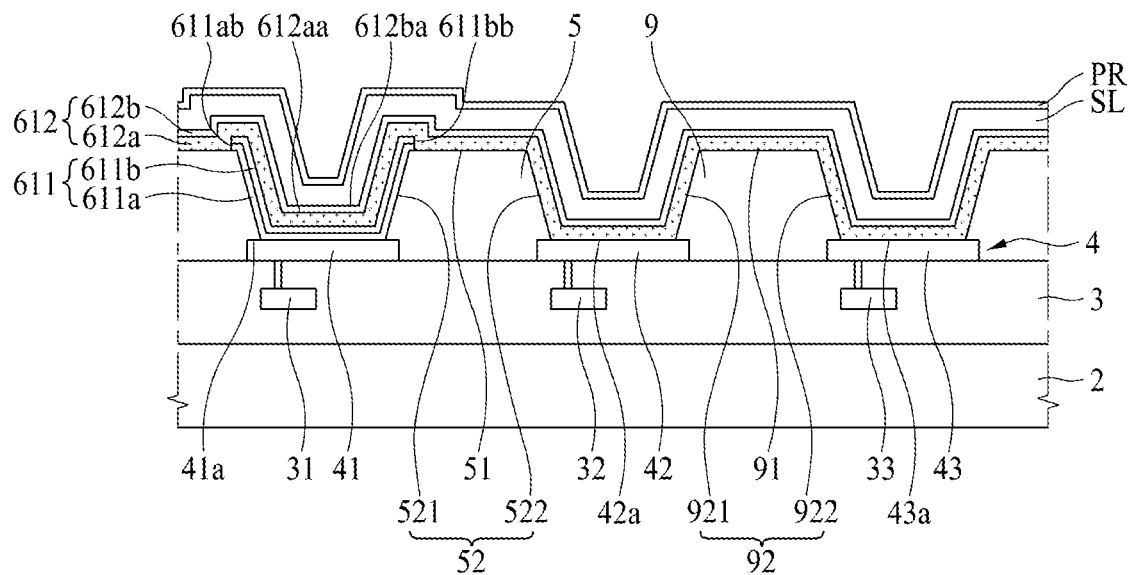
Figure 2I:
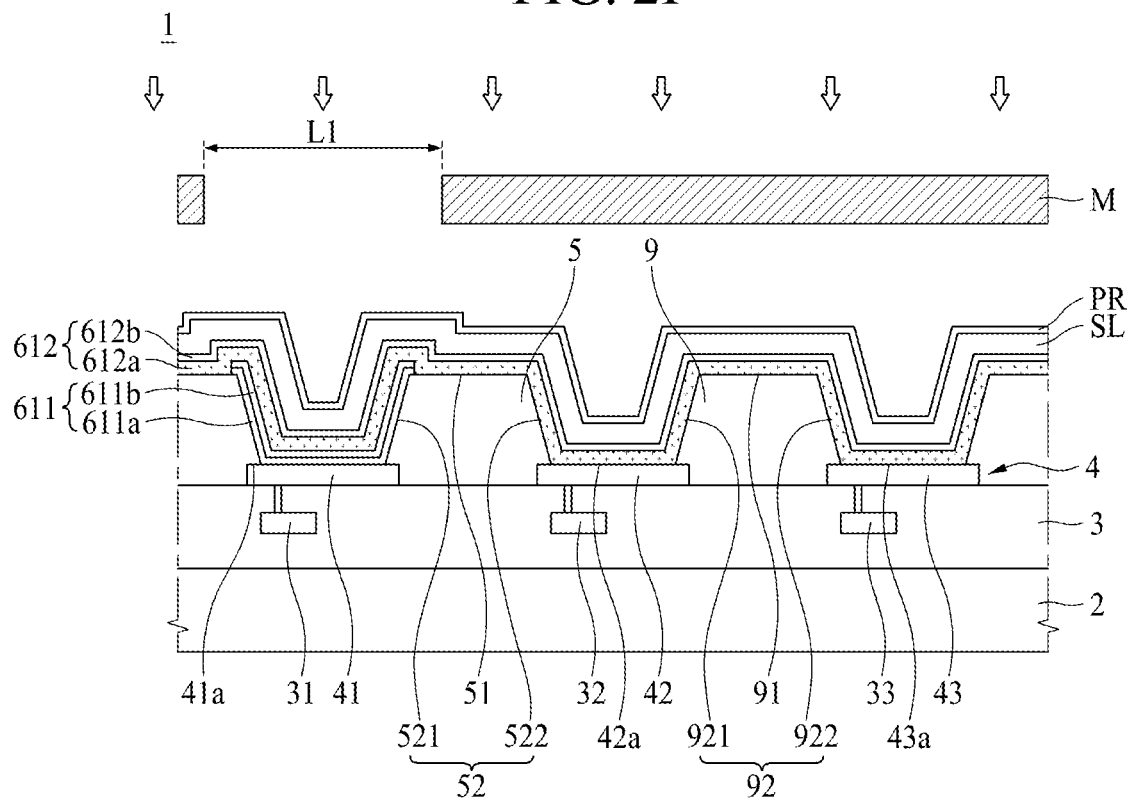
Figure 2J:
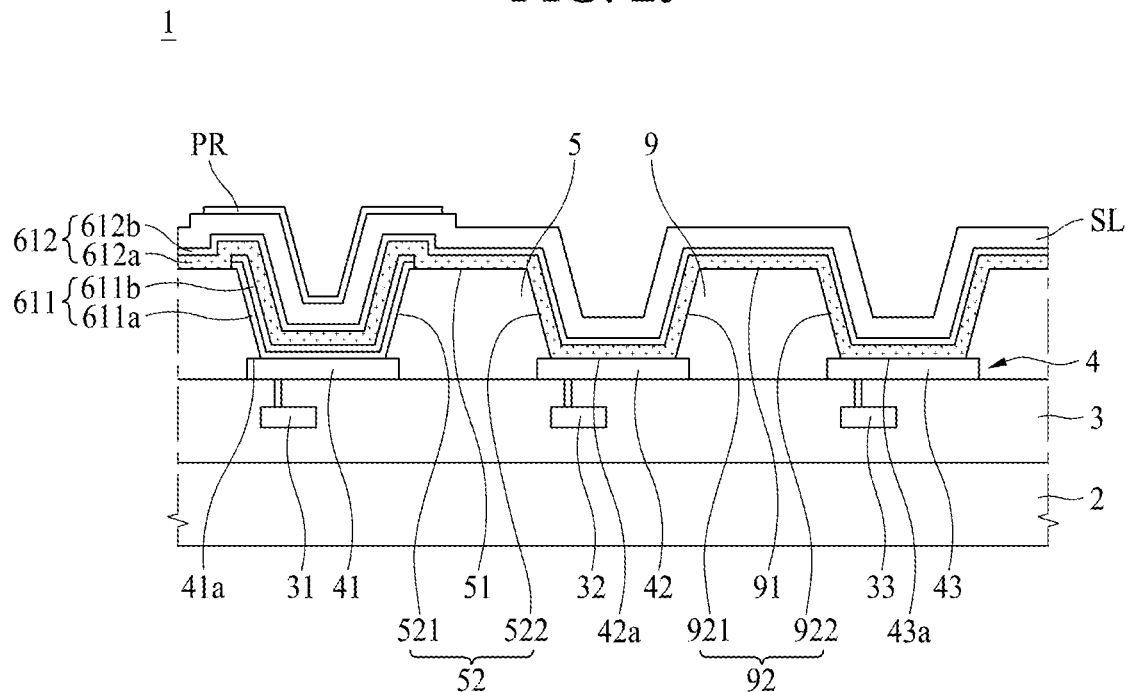
Figure 2M:
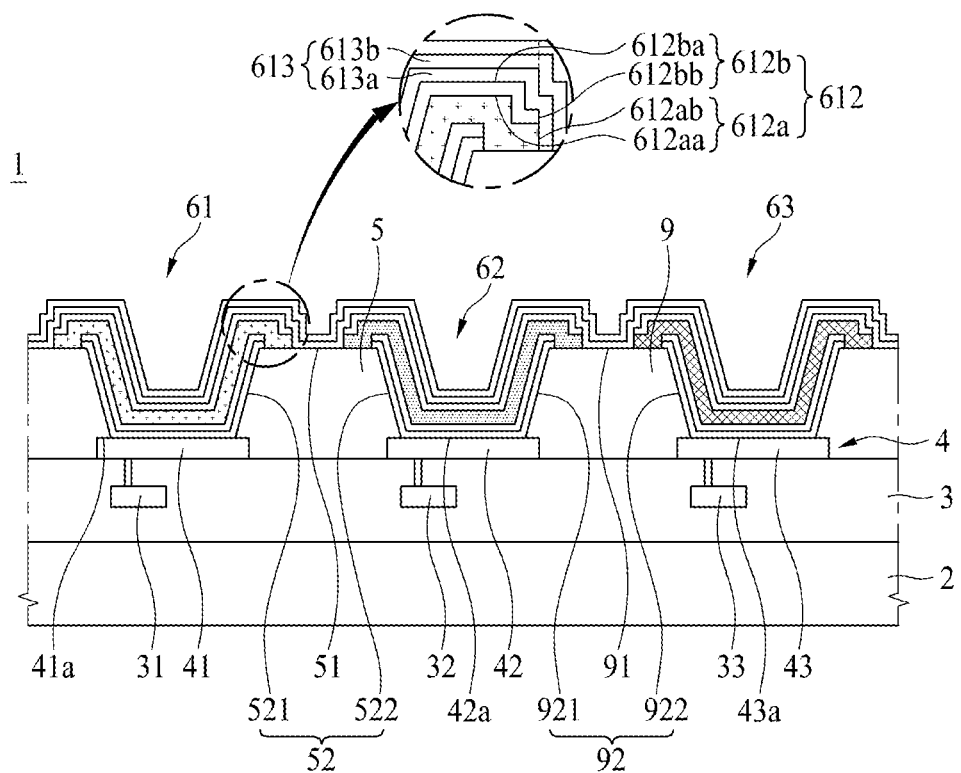
Figure 2N:
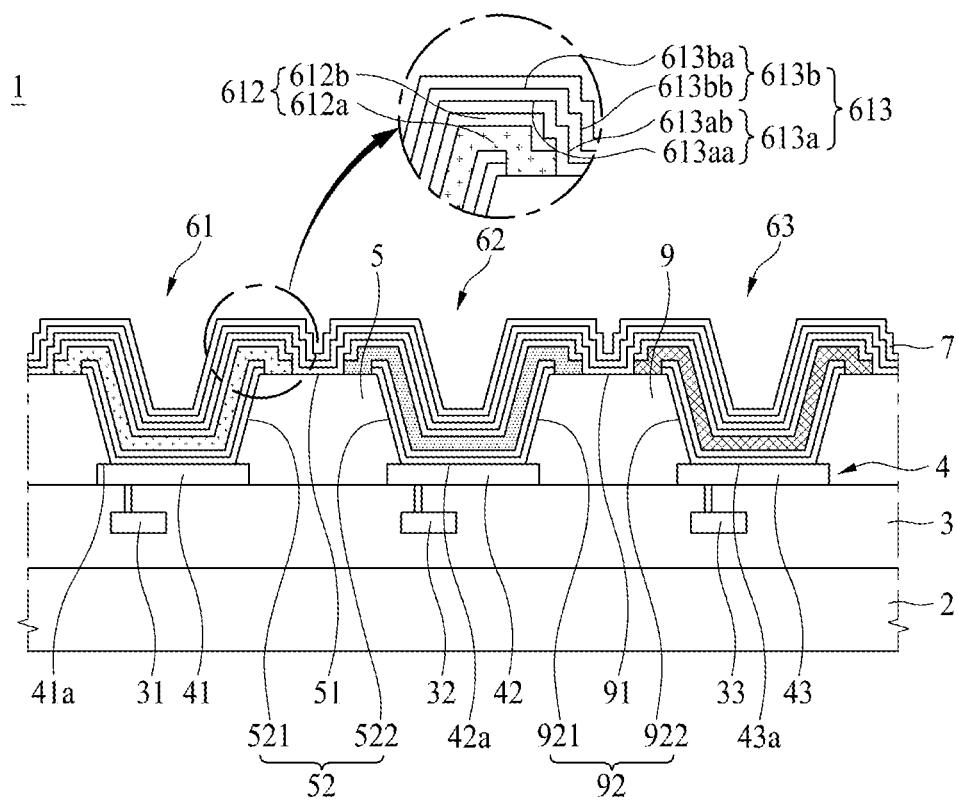
Figure 2O:
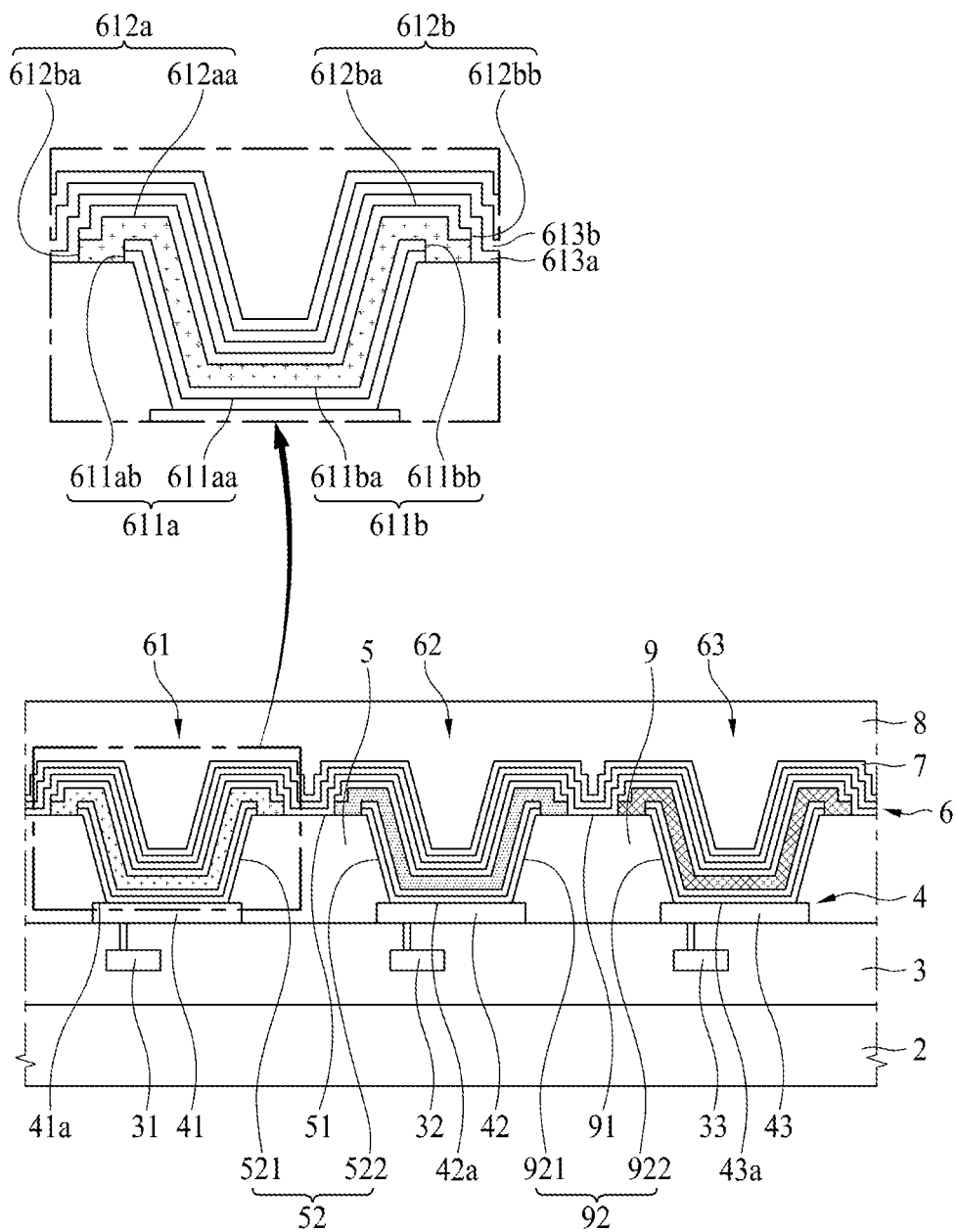

FIG. 1 is a schematic cross-sectional view illustrating a display device according to one aspect of the present disclosure, and FIGS. 2A to 2O are schematic cross-sectional views illustrating a manufacturing process of a display device according to one aspect of the present disclosure.

Referring to FIG. 1 and FIGS. 2A-2O, the display device 1 according to one aspect of the present disclosure comprises a substrate 2, a circuit element layer 3, a first electrode 4, a first bank 5, an organic light emitting layer 6, a second electrode 7, an encapsulation layer 8, and a second bank 9.

The substrate 2 may be a plastic film, a glass substrate, or a semiconductor substrate such as silicon. The substrate 2 may be made of a transparent material or an opaque material.

A first subpixel area 21, a second subpixel area 22, and a third subpixel area 23 are provided on the substrate 2. The second subpixel area 22 according to one example may be arranged to be adjacent to one side of the first subpixel area 21. The third subpixel area 23 according to one example may be arranged to be adjacent to one side of the second subpixel area 22. Therefore, the first subpixel area 21, the second subpixel area 22 and the third subpixel area 23 may sequentially be arranged on the substrate 2. Although not shown, the third subpixel area 23 may be arranged to be adjacent to the first subpixel area 21.

Referring to FIG. 1, the first subpixel area 21 may be provided to emit red (R) light, the second subpixel area 22 may be provided to emit green (G) light, and the third subpixel area 23 may be provided to emit blue (B) light, but these subpixel areas are not limited to this example. Also, an arrangement sequence of the subpixel areas 21, 22 and 23 may be changed in various ways.

Each of the first subpixel area 21, the second subpixel area 22 and the third subpixel area 23 may be provided to include the first electrode 4, the organic light emitting layer 6, and the second electrode 7.

The display device 1 according to one aspect of the present disclosure is provided in a top emission method in which emitted light is emitted to a top portion, and therefore an opaque material as well as a transparent material may be used as a material of the substrate 2.

The circuit element layer 3 is arranged on one surface of the substrate 2. A circuit element comprising a plurality of thin film transistors 31, 32 and 33, various types of signal lines, and a capacitor is provided on the circuit element layer 3 per each of the subpixel areas 21, 22 and 23. The signal lines may include gate lines, data lines, power lines and reference lines, and the thin film transistors 31, 32 and 33 may include a switching thin film transistor, a driving thin film transistor, and a sensing thin film transistor. The subpixel areas 21, 22 and 23 are defined by a crossing structure of gate lines and data lines.

The switching thin film transistor is switched in accordance with a gate signal supplied to the gate line and serves to supply a data voltage supplied from the data line to the driving thin film transistor.

The driving thin film transistor is switched in accordance with the data voltage supplied from the switching thin film transistor to generate a data current from a power source supplied from the power line and serves to supply the generated data current to the first electrode 4.

The sensing thin film transistor serves to sense a threshold voltage deviation of the driving thin film transistor, which is a cause of image degradation, and supplies a current of the driving thin film transistor to the reference line in response to a sensing control signal supplied from the gate line or a separate sensing line.

The capacitor serves to maintain the data voltage supplied to the driving thin film transistor for one frame and is connected to each of a gate terminal and a source terminal of the driving thin film transistor.

A first thin film transistor 31, a second thin film transistor 32, and a third thin film transistor 33 are arranged in the circuit element layer 3 separately for each of the subpixel areas 21, 22 and 23. The first thin film transistor 31 according to one example may be connected to a first sub electrode 41 arranged on the first subpixel area 21 to apply a driving voltage for emitting light of a color corresponding to the first subpixel area 21.

The second thin film transistor 32 according to one example may be connected to a second sub electrode 42 arranged on the second subpixel area 22 to apply a driving voltage for emitting light of a color corresponding to the second subpixel area 22.

The third thin film transistor 33 according to one example may be connected to a third sub electrode 43 arranged on the third subpixel area 23 to apply a driving voltage for emitting light of a color corresponding to the third subpixel area 23.

Each of the first subpixel area 21, the second subpixel area 22 and the third subpixel area 23 according to one example supplies a predetermined current to an organic light emitting layer in accordance with the data voltage of the data line when a gate signal from the gate line is input thereto using each of the thin film transistors 31, 32 and 33. For this reason, the organic light emitting layer of each of the first subpixel area 21, the second subpixel area 22 and the third subpixel area 23 may emit light with a predetermined brightness in accordance with the predetermined current.

The first electrode 4 is formed on the circuit element layer 3. The first electrode 4 according to one example may be formed to include a metal material of high reflectivity such as a deposited structure (Ti/Al/Ti) of aluminum and titanium, a deposited structure (ITO/Al/ITO) of aluminum and ITO, an APC alloy, and a deposited structure (ITO/APC/ITO) of APC alloy and ITO. The APC alloy is an alloy of silver (Ag), palladium (Pb), and Copper (Cu). The first electrode 4 may be an anode. The first electrode 4 may include a first sub electrode 41, a second sub electrode 42 and a third sub electrode 43.

The first sub electrode 41 may be provided on the first subpixel area 21. The first sub electrode 41 may be formed on the circuit element layer 3. The first sub electrode 41 is connected to a source electrode of the first thin film transistor 31 through a contact hole that passes through the circuit element layer 3.

The second sub electrode 42 may be provided on the second subpixel area 22. The second sub electrode 42 may be formed on the circuit element layer 3. The second sub electrode 42 is connected to a source electrode of the second thin film transistor 32 through a contact hole that passes through the circuit element layer 3.

The third sub electrode 43 may be provided on the third subpixel area 23. The third sub electrode 43 may be formed on the circuit element layer 3. The third sub electrode 43 is connected to a source electrode of the third thin film transistor 33 through a contact hole that passes through the circuit element layer 3.

In this case, the first to third thin film transistors 31, 32 and 33 may be N-type TFTs.

If the first to third thin film transistors 31, 32 and 33 are made of P-type TFTs, each of the first to third sub electrodes 41, 42 and 43 may be connected to a drain electrode of each of the first to third thin film transistors 31, 32 and 33.

In other words, each of the first to third sub electrodes 41, 42 and 43 may be connected to a source electrode or a drain electrode in accordance with types of the first to third thin film transistors 31, 32 and 33.

Since the display device 1 according to one aspect of the present disclosure is provided in a top emission method, the first to third sub electrodes 41, 42 and 43 may be provided to include a reflective material to reflect light emitted from the organic light emitting layer 6 to a top portion. In this case, the first to third sub electrodes 41, 42 and 43 may be made of a deposited structure of a transparent electrode formed of a transparent conductive material and a reflective electrode formed of the reflective material. Although not shown, a separate transparent electrode is additionally provided below the reflective electrode, whereby each of the first to third sub electrodes 41, 42 and 43 may be made of a three-layered structure of the separate transparent electrode, the reflective electrode and the transparent electrode which are deposited in due order.

At this time, the reflective electrode provided in the first subpixel area 21, the reflective electrode provided in the second subpixel area 22 and the reflective electrode provided in the third subpixel area 23 may be formed of the same material to have the same thickness.

Likewise, the transparent electrode provided in the first subpixel area 21, the transparent electrode provided in the second subpixel area 22 and the transparent electrode provided in the third subpixel area 23 may be formed of the same material to have the same thickness. However, without limitation to this example, the transparent electrodes provided in the subpixel areas 21, 22 and 23 may have their respective thicknesses different from one another to control a spaced distance of the respective sub electrodes 41, 42 and 43 for the second electrode 7. For example, if the display device is embodied using microcavity characteristic, the thicknesses of the transparent electrodes may be different from one another. The microcavity characteristic means that reinforcing interference occurs to amplify light if a distance between the reflective electrode of the first electrode 4 and the second electrode 7 reaches an integer multiple of a half wavelength λ/2 of light emitted from each of the subpixels 21, 22 and 23 and an amplified level of light is continuously increased to improve external extraction efficiency of light if reflection and re-reflection are repeated. If the display device is embodied to have the microcavity characteristic, the second electrode 7 may include a semi-transparent electrode.

Referring to FIG. 1 again, the first bank 5 is provided between the first sub electrode 41 and the second sub electrode 42. The first bank 5 according to one example is to partition the first subpixel area 21 and the second subpixel area 22 from each other. The first bank 5 serves to define a subpixel area, that is, a light emitting area. Also, an area where the first bank 5 is formed may be defined as a non-light emitting area because the area does not emit light. The first bank 5 may be formed of an organic film such as acryl resin, epoxy resin, phenolic resin, polyamide resin, and polyimide resin. The organic light emitting layer 6 is formed on the first electrode 4 and the first bank 5.

Referring to FIG. 1, the first bank 5 may include an upper surface 51 and an inclined surface 52. The inclined surface 52 may include a first inclined surface 521 and a second inclined surface 522.

The upper surface 51 of the first bank 5 is a surface placed on the top of the first bank 5.

The first inclined surface 521 of the first bank 5 is a surface extended from the upper surface 51 to an upper surface 41a of the first sub electrode 41. Therefore, the first inclined surface 521 may have a predetermined angle with the upper surface 41a of the first sub electrode 41. The predetermined angle may be greater than 50° and less than 90° as a width of the bank becomes narrow in accordance with high resolution of the display device. A width of the bank may become narrow as the distance between subpixel areas becomes narrow.

The second inclined surface 522 of the first bank 5 is a surface extended from the upper surface 51 to an upper surface 42a of the second sub electrode 42. Therefore, the second inclined surface 522 may have a predetermined angle with the upper surface 42a of the second sub electrode 42. An angle between the second inclined surface 522 and the upper surface 42a of the second sub electrode 42 may be equal to that between the first inclined surface 521 and the upper surface 41a of the first sub electrode 41.

Referring to FIG. 1, the display device 1 according to one aspect of the present disclosure may further include a second bank 9.

The second bank 9 is provided between the second sub electrode 42 and the third sub electrode 43. The second bank 9 according to one example is to partition the second subpixel area 22 and the third subpixel area 23 from each other. The second bank 9 serves to define a subpixel area, that is, a light emitting area. Also, an area where the second bank 9 is formed may be defined as a non-light emitting area because the area does not emit light. The second bank 9 may be formed of the same material as that of the first bank 5. The organic light emitting layer 6 is formed on the first electrode 4 and the second bank 9.

Referring to FIG. 1, the second bank 9 may include an upper surface 91 and an inclined surface 92. The inclined surface 92 may include a first inclined surface 921 and a second inclined surface 922.

The upper surface 91 of the second bank 9 is a surface placed on the top of the second bank 9.

The first inclined surface 921 of the second bank 9 is a surface extended from the upper surface 91 to the upper surface 42a of the second sub electrode 42. Therefore, the first inclined surface 921 may have a predetermined angle with the upper surface 42a of the second sub electrode 42. The predetermined angle may be greater than 50° and less than 90° as a width of the bank becomes narrow in accordance with high resolution of the display device.

The second inclined surface 922 of the second bank 9 is a surface extended from the upper surface 91 to an upper surface 43a of the third sub electrode 43. Therefore, the second inclined surface 922 may have a predetermined angle with the upper surface 43a of the third sub electrode 43. An angle between the second inclined surface 922 and the upper surface 43a of the third sub electrode 43 may be equal to that between the first inclined surface 921 and the upper surface 42a of the second sub electrode 42.

The organic light emitting layer 6 is arranged on the first electrode 4. The organic light emitting layer 6 according to one example may include a hole transporting layer HTL, a light emitting layer EML, a hole blocking layer HBL, and an electron transporting layer ETL. The organic light emitting layer 6 may further include a hole injecting layer HIL and an electron injecting layer EIL.

The hole injecting layer HIL, the hole transporting layer HTL, the electron transporting layer ETL, and the electron injecting layer EIL of the organic light emitting layer 6 are intended to improve emission efficiency of the light emitting layer EML. The hole transporting layer HTL and the electron transporting layer ETL are intended to balance between electrons and holes, and the hole injecting layer HIL and the electron injecting layer EIL are intended to enhance injection of electrons and holes.

In more detail, the hole injecting layer HIL may facilitate injection of holes by lowering an injection energy barrier of holes injected from an anode material. The hole transporting layer HTL serves to transport the holes injected from an anode to the light emitting layer without loss.

The light emitting layer EML is a layer for emitting light through recombination of holes injected from an anode and electrons injected from a cathode, and may emit light of red, blue and green colors in accordance with recombination energy inside the light emitting layer and form a white light emitting layer by configuring a plurality of light emitting layers. The hole blocking layer HBL may be provided between the light emitting layer EML and the electron transporting layer ETL to block movement of holes which are not combined with electrons in the light emitting layer EML.

The electron transporting layer ETL serves to transport the electrons injected from the cathode to the light emitting layer. The electron injecting layer EIL serves to facilitate injection of the electrons from the cathode by lowering a potential barrier during injection of the electrons.

If a high potential voltage is applied to the first electrode 4 and a low potential voltage is applied to the second electrode 7, holes and electrons are moved to the light emitting layer through the hole transporting layer and the electron transporting layer, respectively and combined with each other in the light emitting layer to emit light.

The organic light emitting layer 6 may include a first organic light emitting layer 61, a second organic light emitting layer 62 and a third organic light emitting layer 63.

The first organic light emitting layer 61 may be arranged on the first sub electrode 41. The first organic light emitting layer 61 may be formed on the first sub electrode 41 after the first electrode 4, the first bank 5 and the second bank 9 are formed. The first organic light emitting layer 61 may include a first pattern layer 611, a second pattern layer 612, and a third pattern layer 613.

The first pattern layer 611 of the first organic light emitting layer 61, as shown in FIG. 1, may include a hole injecting layer 611a and a hole transporting layer 611b. The second pattern layer 612 of the first organic light emitting layer 61 may include a light emitting layer 612a and a hole blocking layer 612b. The third pattern layer 613 of the first organic light emitting layer 61 may include an electron transporting layer 613a and an electron injecting layer 613b. Although not shown, the first pattern layer 611 of the first organic light emitting layer 61 may be provided with only the hole transporting layer 611a, the second pattern layer 612 of the first organic light emitting layer 61 may be provided with only the light emitting layer 612a or may be provided with a passivation layer for protecting the light emitting layer 612a, and the third pattern layer 613 of the first organic light emitting layer 61 may be provided with only the electron transporting layer 613a. If the second pattern layer 612 of the first organic light emitting layer 61 is provided with the light emitting layer 612a and the passivation layer, the passivation layer may serve to protect the light emitting layer 612a from an etching gas. For example, the passivation layer may be an inorganic passivation layer that includes IZO of high resistance or Si based inorganic film. Therefore, the light emitting layer 612a of the first organic light emitting layer 61 is less damaged by the etching gas than the case that there is no passivation layer, whereby its lifespan may become longer.

The second organic light emitting layer 62 may be arranged on the second sub electrode 42. The second organic light emitting layer 62 may be formed on the second sub electrode 42 after the first electrode 4, the first bank 5 and the second bank 9 are formed. The second organic light emitting layer 62 may include a first pattern layer 621, a second pattern layer 622, and a third pattern layer 623.

The first pattern layer 621 of the second organic light emitting layer 62, as shown in FIG. 1, may include a hole injecting layer 621a and a hole transporting layer 621b. The second pattern layer 622 of the second organic light emitting layer 62 may include a light emitting layer 622a and a hole blocking layer 622b. The third pattern layer 623 of the second organic light emitting layer 62 may include an electron transporting layer 623a and an electron injecting layer 623b. Although not shown, the first pattern layer 621 of the second organic light emitting layer 62 may be provided with only the hole transporting layer 621a, the second pattern layer 622 of the second organic light emitting layer 62 may be provided with only the light emitting layer 622a or may be provided with a passivation layer for protecting the light emitting layer 622a, and the third pattern layer 623 of the second organic light emitting layer 62 may be provided with only the electron transporting layer 623a. If the second pattern layer 622 of the second organic light emitting layer 62 is provided with the light emitting layer 622a and the passivation layer, the passivation layer may serve to protect the light emitting layer 622a from an etching gas. For example, the passivation layer may be an inorganic passivation layer that includes IZO of high resistance or Si based inorganic film. Therefore, the light emitting layer 622a of the second organic light emitting layer 62 is less damaged by the etching gas than the case that there is no passivation layer, whereby its lifespan may become longer.

The third organic light emitting layer 63 may be arranged on the third sub electrode 43. The third organic light emitting layer 63 may be formed on the third sub electrode 43 after the first electrode 4, the first bank 5 and the second bank 9 are formed. The third organic light emitting layer 63 may include a first pattern layer 631, a second pattern layer 632, and a third pattern layer 633.

The first pattern layer 631 of the third organic light emitting layer 63, as shown in FIG. 1, may include a hole injecting layer 631a and a hole transporting layer 631b. The second pattern layer 632 of the third organic light emitting layer 63 may include a light emitting layer 632a and a hole blocking layer 632b. The third pattern layer 633 of the third organic light emitting layer 63 may include an electron transporting layer 633a and an electron injecting layer 633b. Although not shown, the first pattern layer 631 of the third organic light emitting layer 63 may be provided with only the hole transporting layer 631a, the second pattern layer 632 of the third organic light emitting layer 63 may be provided with only the light emitting layer 632a or may be provided with a passivation layer for protecting the light emitting layer 632a, and the third pattern layer 633 of the third organic light emitting layer 63 may be provided with only the electron transporting layer 633a. If the second pattern layer 632 of the third organic light emitting layer 63 is provided with the light emitting layer 632a and the passivation layer, the passivation layer may serve to protect the light emitting layer 632a from an etching gas. For example, the passivation layer may be an inorganic passivation layer that includes IZO of high resistance or Si based inorganic film. Therefore, the light emitting layer 632a of the third organic light emitting layer 63 is less damaged by the etching gas than the case that there is no passivation layer, whereby its lifespan may become longer.

In this case, if each of the second pattern layers 612, 622 and 632 of each of the first to third organic light emitting layers 61, 62 and 63 is provided with the light emitting layer and the passivation layer, the passivation layer may be provided as a passivation layer of high resistance as described above.

In more detail, the passivation layer according to one example may be formed of a material robust to an etching solution to protect the light emitting layers 612a, 622a and 632a of the first to third organic light emitting layers 61, 62 and 63 from the etching solution. For example, the passivation layer may be formed of, but not limited to, IZO, which is a transparent conductive material, and may further include an oxide such as ITO and $Al_2O_3$. If the passivation layer is formed of IZO, an indium oxide and a zinc oxide may be provided at a ratio of 9:1. Therefore, the passivation layer may have a resistance of Giga ($10^9$)-Tera ($10^{12}$) per unit area. If the resistance per unit area is Giga ($10^9$), the passivation layer serve as an electrode, and short may occur. If the resistance per unit area exceeds Tera ($10^{12}$), the passivation layer may interrupt working of the respective light emitting layers 612a, 622a and 632a of the first to third organic light emitting layers 61, 62 and 63. Therefore, in the display device 1 according to one aspect of the present disclosure, the passivation layer may protect the light emitting layers 612a, 622a and 632a from the etching solution without severing as an electrode due to high resistance. Meanwhile, the passivation layer may not interrupt working of the light emitting layers 612a, 622a and 632a even though it surrounds the respective light emitting layers 612a, 622a and 632a due to a tunneling effect.

The passivation layer may have a film thickness of 1000 Å or less. If the film thickness of the passivation layer exceeds 1000 Å, the film thickness becomes too thick, whereby light emitted from each of the light emitting layers 612a, 622a and 632a fails to well transmit the passivation layer and therefore light efficiency may be deteriorated. Therefore, in the display device 1 according to one aspect of the present disclosure, the passivation layer serves to perform a function of step-coverage that can cover particles of a certain size without deteriorating light efficiency of each of the light emitting layers 612a, 622a and 632a, whereby a short between the first electrode 4 and the second electrode 7 may be prevented from occurring between the first electrode 4 and the second electrode 7 to contribute to reduce an initial dark point during working of the first to third organic light emitting layers 61, 62 and 63.

In the display device 1 according to one aspect of the present disclosure, as shown in FIG. 1, the first pattern layer 611 of the first organic light emitting layer 61 and the first pattern layer 621 of the second organic light emitting layer 62 are spaced apart from each other, and the second pattern layer 612 of the first organic light emitting layer 61 and the second pattern layer 622 of the second organic light emitting layer 62 are spaced apart from each other, and the third pattern layer 613 of the first organic light emitting layer 61 and the third pattern layer 623 of the second organic light emitting layer 62 are connected with each other.

This means that the first pattern layer 611 and the second pattern layer 612 of the first organic light emitting layer 61 are patterned separately from the first pattern layer 621 and the second pattern layer 622 of the second organic light emitting layer 62, and may mean that the third pattern layer 613 of the first organic light emitting layer 61 and the third pattern layer 623 of the second organic light emitting layer 62 are patterned simultaneously or patterned with the same pattern. In this case, 'patterned' means that each pattern layer is formed through etching based on exposure through a mask M, developing and etching gas.

The reason why that the first pattern layer 611 and the second pattern layer 612 of the first organic light emitting layer 61 are patterned separately from the first pattern layer 621 and the second pattern layer 622 of the second organic light emitting layer 62 is to emit light of different colors in accordance with each subpixel area.

The above reason may equally be applied to the case that the first pattern layer 631 and the second pattern layer 632 of the third organic light emitting layer 63 are patterned separately from the first pattern layer 611 and the second pattern layer 612 of the first organic light emitting layer 61 and the first pattern layer 621 and the second pattern layer 622 of the second organic light emitting layer 62.

The first organic light emitting layer 61, the second organic light emitting layer 62 and the third organic light emitting layer 63 may respectively emit red (R) light, green (G) light, and blue (B) light. However, without limitation to this example, the first to third organic light emitting layers 61, 62 and 63 may be provided to emit light of various colors. Also, if the first organic light emitting layer 61, the second organic light emitting layer 62 and the third organic light emitting layer 63 respectively emit red (R) light, green (G) light, and blue (B) light, arrangement sequence of the organic light emitting layers 61, 62 and 63 for the sub electrodes 41, 42 and 43 may be combined in various ways. As the first organic light emitting layer 61, the second organic light emitting layer 62 and the third organic light emitting layer 63 respectively emit red (R) light, green (G) light, and blue (B) light, the display device 1 according to one aspect of the present disclosure may not use a color filter, whereby the manufacturing cost may be reduced. This is equally applied to the display device 1 according to another aspect of the present disclosure.

The reason why that the third pattern layer 613 of the first organic light emitting layer 61 and the third pattern layer 623 of the second organic light emitting layer 62 are simultaneously formed to be patterned or formed with the same pattern is to reduce a tact time until the complete display device 1 is manufactured by reducing the number of manufacturing processes of the display device 1 according to one aspect of the present disclosure.

The above reason may equally be applied to the case that the third pattern layer 633 of the third organic light emitting layer 63 are simultaneously formed to be patterned or formed with the same pattern to be connected with the third pattern layer 613 of the first organic light emitting layer 61 and the third pattern layer 623 of the second organic light emitting layer 62.

Meanwhile, in the display device 1 according to one aspect of the present disclosure, as shown in FIG. 1, the second pattern layer 612 of the first organic light emitting layer 61 may be provided to cover an upper surface and a side of the first pattern layer 611 of the first organic light emitting layer 61.

This means that the second pattern layer 612 and the first pattern layer 611 of the first organic light emitting layer 61 are formed through a separate process, more specifically means that the second pattern layer 612 of the first organic light emitting layer 61 is formed to be patterned later than the first pattern layer 611 of the first organic light emitting layer 61.

As described above, the plurality of organic light emitting layers 61, 62 and 63 may respectively be formed on the sub electrodes 41, 42 and 43 in due order. Particularly, in case of a head mounted display of ultra-high resolution, the plurality of organic light emitting layers 61, 62 and 63 may be formed by a dry etching process to make a compact pixel interval. This dry etching process patterns the organic light emitting layers by using an etching gas. Since each of the organic light emitting layers 61, 62 and 63 includes a hole injecting layer, a hole transporting layer, a light emitting layer, a hole blocking layer, an electron transporting layer, and an electron injecting layer, the hole injecting layer, the hole transporting layer, the light emitting layer, the hole blocking layer, the electron transporting layer, and the electron injecting layer may be exposed to the etching gas and thus be in contact with the etching gas during the process of forming each of the organic light emitting layers 61, 62 and 63.

Therefore, if the hole injecting layer, the hole transporting layer, the light emitting layer, the hole blocking layer, the electron transporting layer, and the electron injecting layer are too exposed to the etching gas, a problem may occur in that light emitting efficiency is deteriorated. Particularly, after the hole injecting layer, the hole transporting layer, the light emitting layer, the hole blocking layer, the electron transporting layer, and the electron injecting layer are sequentially deposited, if the hole injecting layer, the hole transporting layer, the light emitting layer, the hole blocking layer, the electron transporting layer, and the electron injecting layer are simultaneously exposed to the etching gas and patterned, the electron injecting layer arranged on the uppermost is exposed to the etching gas for a longer time than the hole injecting layer last patterned, whereby the electron injecting layer may be more damaged. Particularly, if the light emitting layer is damaged by the etching gas, light emitting efficiency is rapidly deteriorated, whereby it is important to pattern the light emitting layer by appropriately controlling the time exposed to the etching gas so as to allow the light emitting layer not to be damaged.

Therefore, in the display device 1 according to one aspect of the present disclosure, the first pattern layer 611 including the hole injecting layer 611a and the hole transporting layer 611b and the second pattern layer 612 including the light emitting layer 612a and the hole blocking layer 612b of the first organic light emitting layer 61 are patterned separately from each other to reduce the time when the second pattern layer 612 of the first organic light emitting layer 61 including the light emitting layer 612a is exposed to etching gas, whereby a damage of the light emitting layer 612a may be reduced and therefore a defect rate of the display device of which manufacturing process is completed may be reduced.

Referring to FIG. 1 again, the second electrode 7 is arranged on the organic light emitting layer 6, the first bank 5, and the second bank 9. The second electrode 7 according to one aspect is a common layer commonly formed on the first subpixel area 21, the second subpixel area 22 and the third subpixel area 23. The second electrode 7 may be formed of a transparent conductive material (TCO) such as ITO and IZO, which can transmit light, or may be formed of a semi-transmissive conductive material such as Mg, Ag, or Alloy of Mg and Ag.

The encapsulation layer 8 may be formed on the second electrode 7. The encapsulation layer 8 serves to prevent oxygen or water from being permeated into the organic light emitting layer 6 and the second electrode 7. To this end, the encapsulation layer 8 may include at least one inorganic film and at least one organic film.

For example, the encapsulation layer 8 may include a first inorganic film, an organic film, and a second inorganic film. In this case, the first inorganic film is formed to cover the second electrode 7. The organic film is formed to cover the first inorganic film. The organic film may be formed at a length long enough to prevent particles from being permeated into the organic light emitting layer 6 and the second electrode 7 by passing through the first inorganic film. The second inorganic film is formed to cover the organic film.

For convenience of description, up to the encapsulation layer 8 arranged on the second electrode 7 is shown in FIG. 1. If the organic light emitting layer includes red, green and blue organic light emitting layers respectively emitting red (R), green (G) and blue (B) lights, the red, green and blue color filters may not be arranged on the encapsulation layer 8.

In the display device 1 according to one aspect of the present disclosure, through the following manufacturing process, the first pattern layer 611 of the first organic light emitting layer may be spaced apart from the first pattern layer 621 of the second organic light emitting layer, the second pattern layer 612 of the first organic light emitting layer may be spaced apart from the second pattern layer 622 of the second organic light emitting layer, and the third pattern layer 613 of the first organic light emitting layer and the third pattern layer 623 of the second organic light emitting layer may be connected with each other. Also, through the following manufacturing process, the second pattern layer 612 of the first organic light emitting layer 61 may be provided to cover the upper surface and the side of the first pattern layer 611 of the first organic light emitting layer 61. The organic light emitting layer 6 may be formed in such a manner that the first organic light emitting layer 61, the second organic light emitting layer 62 and the third organic light emitting layer 63 are patterned in due order. However, without limitation to this example, the organic light emitting layers may be formed to be patterned in other order. Hereinafter, the case that the first organic light emitting layer 61, the second organic light emitting layer 62 and the third organic light emitting layer 63 are formed in due order will be described as an example.

Referring to FIGS. 2A to 2E, in a state that the first electrode 4, the first bank 5 and the second bank 9 are formed on the substrate 2 and the circuit element layer 3, the hole injecting layer 611a and the hole transporting layer 611b of the first pattern layer 611 of the first organic light emitting layer 61 are entirely deposited in due order and a shield layer SL and a PR layer are deposited thereon in due order. Afterwards, a mask M (shown in FIG. 2E) is arranged on a place except the position where the first pattern layer 611 is to be patterned and then a portion to be patterned is subjected to exposure. Therefore, property of the exposed PR layer is changed. For example, property of the exposed PR layer may be changed not to be etched even with a developing solution.

In this case, the mask M may be provided to have a hole of a first length L1 (shown in FIG. 2E). For example, the first length L1 may be a length of the first pattern layer 611 that may be formed to be extended from the upper surface 41a of the first sub electrode to the upper surface of a bank arranged at both sides through an inclined surface of the bank. Therefore, if a patterning process for the first pattern layer 611 is completed, the first pattern layer 611 may be extended from the upper surface 41a of the first sub electrode 41 to cover a portion of the upper surface of each of the banks arranged at both sides. The first pattern layer 611 may be provided in a symmetrical shape around the first sub electrode 41.

Then, referring to FIG. 2F, a primary removing process is performed to remove the other PR layer except the PR layer, which is arranged on the area where the first pattern layer 611 is to be formed, by using a developing solution. The PR layer removed by the developing solution may be corroded by being put in the developing solution and then removed.

Then, referring to FIG. 2G, a secondary removing process is performed to remove the entire shield layer SL including a shield layer SL, which is arranged on the area where the first pattern layer 611 is to be formed, by using an etching gas. In this case, the PR layer arranged on the shield layer SL may be removed as the shield layer SL is removed. A reactive gas containing $O_2$ may be used as the etching gas, but the etching gas is not limited to such as reactive gas. If the reactive gas containing $O_2$ is used as the etching gas, a damage of an organic material may be increased when the time exposed to $O_2$ becomes longer. Therefore, in the display device 1 according to one aspect of the present disclosure, the first pattern layer 611 and the second pattern layer 612 may be patterned separately from each other to reduce the time exposed to $O_2$, whereby the damage of the organic layer due to the etching gas may be reduced. As a method for reducing the damage of the organic layer, Ar or $N_2$ which is an inert gas in comparison with the reactive gas may be used as the etching gas. However, in this case, a problem occurs in that a tact time for patterning is increased due to a low etching rate.

Therefore, in the display device 1 according to one aspect of the present disclosure, the organic layer may be patterned using the reactive gas containing O2 to reduce the tact time, and the first pattern layer 611 and the second pattern layer 612 may be patterned separately from each other to reduce the time when the organic layer is exposed to the etching gas, whereby the damage of the organic layer may be reduced.

Meanwhile, in the display device 1 according to one aspect of the present disclosure, since the hole injecting layer 611a and the hole transporting layer 611b of the first pattern layer 611 are simultaneously patterned by the etching gas, as shown in a portion A of FIG. 2G, both ends of the hole injecting layer 611a of the first pattern layer 611 may be matched with both ends of the hole transporting layer 611b of the first pattern layer 611. In more detail, the lower surface of the hole transporting layer 611b may adjoin an upper surface 611aa of the hole injecting layer 611a of the first pattern layer 611, and a side 611bb of the hole transporting layer 611b and a side 611ab of the hole injecting layer 611a may be arranged on the same vertical line.

Then, referring to FIG. 2H, the light emitting layer 612a of the second pattern layer 612 is entirely deposited to cover the side 611ab of the hole injecting layer 611a and the side 611bb and the upper surface 611ba of the hole transporting layer 611b of the first pattern layer 611, and the hole blocking layer 612b is entirely deposited on the upper surface 612aa of the light emitting layer 612a. The shield layer SL and the PR layer are sequentially deposited on the upper surface 612ba of the hole blocking layer 612b in due order.

Then, referring to FIGS. 21 to 2K, in the same manner as FIG. 2E, the mask M is arranged such that a hole having a first length L1 is arranged on a place where the second pattern layer 612 is to be patterned, and then is subjected to exposure. Therefore, property of the exposed PR layer may be changed. The other PR layer except the exposed PR layer may be removed using a developing solution, and the entire shield layer SL including the shield layer SL arranged on the area where the second pattern layer 612 is to be formed is removed using the etching gas, whereby the second pattern layer 612 is patterned.

In this case, in the display device 1 according to one aspect of the present disclosure, since the second pattern layer 612 covers the first pattern layer 611, an area where the second pattern layer 612 is subjected to exposure should be greater than an area where the first pattern layer 611 is subjected to exposure. Therefore, the second pattern layer 612 may be subjected to exposure using the mask M having a hole longer than the first length L1 during the process of allowing the second pattern layer 612 to be subjected to exposure. However, if the first pattern layer 611 and the second pattern layer 612 are formed using the mask M having different types of holes, since a plurality of masks M are required, problems occur in that the manufacturing cost is increased and a tact time is increased in accordance with replacement of the mask M.

Therefore, in the display device 1 according to one aspect of the present disclosure, the second pattern layer 612 may cover the first pattern layer 611 by using only one mask M having a hole of a first length L1. In more detail, in the display device 1 according to one aspect of the present disclosure, the first length L1 is provided such that the second pattern layer 612 is patterned, and the time when the first pattern layer 611 is exposed to the etching gas during patterning in FIG. 2G is longer than the time when the second pattern layer 612 is exposed to the etching gas during patterning in FIG. 2K, whereby the pattern layers may be patterned such that the length of the first pattern layer 611 is shorter than that of the second pattern layer 612. Afterwards, the second pattern layer 612 is deposited and then the pattern layers are patterned such that the time exposed to the etching gas is reduced, whereby the second pattern layer 612 may cover the first pattern layer 611 to seal the first pattern layer 611. Therefore, in the display device 1 according to one aspect of the present disclosure, the first pattern layer 611 and the second pattern layer 612 covering the first pattern layer 611 may be formed using only one mask M having a hole having the first length L1. Therefore, if the manufacturing method of the display device 1 according to one aspect of the present disclosure is used, the manufacturing cost may be reduced and the mask M does not need to be replaced with another one and therefore a tact time may be reduced.

Meanwhile, since the light emitting layer 612a and the hole blocking layer 612b of the second pattern layer 612 are simultaneously patterned by the etching gas, both ends of the light emitting layer 612a of the second pattern layer 612 may be matched with both ends of the hole blocking layer 612b of the second pattern layer 612 as shown in a portion B shown in FIG. 2k. In more detail, the lower surface of the hole blocking layer 612b may adjoin the upper surface 612aa of the light emitting layer 612a of the second pattern layer 612, and the side 612bb of the hole blocking layer 612b and the side 612ab of the light emitting layer 612a may be arranged on the same vertical line.

Then, referring to FIG. 2L, in the display device 1 according to one aspect of the present disclosure, the process of FIGS. 2B to 2K may repeatedly be performed, whereby the first pattern layer 621 including the hole injecting layer 621a and the hole transporting layer 621b, the second pattern layer 622 including the light emitting layer 622a and the hole blocking layer 622b and the third pattern layer 623 including the electron transporting layer 623a and the electron injecting layer 623b of the second organic light emitting layer 62 may be formed on the upper surface 42a of the second sub electrode 42. Also, the first pattern layer 631 including the hole injecting layer 631a and the hole transporting layer 631b, the second pattern layer 632 including the light emitting layer 632a and the hole blocking layer 632b and the third pattern layer 633 including the electron transporting layer 633a and the electron injecting layer 633b of the third organic light emitting layer 63 may be formed on the upper surface 43a of the third sub electrode 43.

In this case, the first pattern layer 611 and the second pattern layer 612 of the first organic light emitting layer 61 and the first pattern layer 621 and the second pattern layer 622 of the second organic light emitting layer 62 may be arranged on the upper surface 51 of the first bank. The first pattern layer 611 of the first organic light emitting layer 61 and the first pattern layer 621 of the second organic light emitting layer 62 may be arranged to be spaced apart from each other on the upper surface 51 of the first bank, and the second pattern layer 612 of the first organic light emitting layer 61 and the second pattern layer 622 of the second organic light emitting layer 62 may be arranged to be spaced apart from each other on the upper surface 51 of the first bank. Therefore, in the display device 1 according to one aspect of the present disclosure, as the first pattern layer 611 of the first organic light emitting layer 61 and the first pattern layer 621 of the second organic light emitting layer 62 are connected with each other, or the second pattern layer 612 of the first organic light emitting layer 61 and the second pattern layer 622 of the second organic light emitting layer 62 are connected with each other, lights of different colors may be prevented from being emitted between the respective subpixel areas adjacent to each other, whereby the problem of the color mixture may be solved.

Then, referring to FIGS. 1, 2M and 2N, the third pattern layer 613 of the first organic light emitting layer 61 is entirely deposited as a common layer to cover the second pattern layer 612 covering the first pattern layer 611 of the first organic light emitting layer 61, the second pattern layer 622 covering the first pattern layer 621 of the second organic light emitting layer 62, the second pattern layer 632 covering the first pattern layer 631 of the third organic light emitting layer 63, the first bank 5, and the second bank 9.

In this case, the third pattern layer 613 of the first organic light emitting layer 61 may be connected with the third pattern layer 623 of the second organic light emitting layer 62 and the third pattern layer 633 of the third organic light emitting layer 63 and therefore may be a common layer that covers the first bank 5 and the second bank 9 as well as the second pattern layer of each organic light emitting layer. In more detail, if the third pattern layer 613 of the first organic light emitting layer 61 is provided as the electron injecting layer 613b provided to cover the electron transporting layer 613a and the upper surface 613aa (shown in FIG. 2N) and the side 613ab (shown in FIG. 2N) of the electron transporting layer 613a, the third pattern layer 623 (shown in FIG. 1) of the second organic light emitting layer 62 may be provided with the electron transporting layer 623a (shown in FIG. 1) connected with the electron transporting layer 613a of the first organic light emitting layer 61 and the electron injecting layer 623b (shown in FIG. 1) connected with the electron injecting layer 613b of the first organic light emitting layer 61, and the third pattern layer 633 (shown in FIG. 1) of the third organic light emitting layer 63 may be provided with the electron transporting layer 633a (shown in FIG. 1) connected with the electron transporting layer 623a of the second organic light emitting layer 62 and the electron injecting layer 633b (shown in FIG. 1) connected with the electron injecting layer 623b of the second organic light emitting layer 62. Therefore, the third pattern layer 623 of the second organic light emitting layer 62 and the third pattern layer 633 of the third organic light emitting layer 63 may be provided with the same pattern as the third pattern layer 613 of the first organic light emitting layer 61.

The third pattern layer 613 of the first organic light emitting layer 61 will be described as a pattern of the third pattern layer 613. The third pattern layer 613 of the first organic light emitting layer 61 may be provided to cover the upper surface and the side of the second pattern layer 612. In more detail, the electron transporting layer 613a of the third pattern layer 613 of the first organic light emitting layer 61 may be provided to cover the side 612ab of the light emitting layer 612a of the second pattern layer 612 and the upper surface 612ba and the side 612bb of the hole blocking layer 612b. Therefore, the second pattern layer 612 of the first organic light emitting layer 61 may be sealed by the third pattern layer 613, and the third pattern layer 613 may prevent particles such as water from being permeated into the second pattern layer 612. Likewise, the second pattern layer 622 of the second organic light emitting layer 62 and the second pattern layer 632 of the third organic light emitting layer 63 may also be sealed by the third pattern layer 613 of the first organic light emitting layer 61.

Consequently, if an electric field is formed between the first electrode 4 and the second electrode 7, the third pattern layer 613 of the first organic light emitting layer 61, the third pattern layer 623 of the second organic light emitting layer 62, and the third pattern layer 633 of the third organic light emitting layer 63 may contribute to light emission together with the first pattern layer and the second pattern layer of each organic light emitting layer, and may serve as passivation films that prevent particles such as water from being permeated into the first pattern layer and the second pattern layer of each organic light emitting layer.

Then, referring to FIGS. 2N and 2O, the second electrode 7 is formed on the entire surface to cover the upper surface and the side of the third pattern layer 613 of the first organic light emitting layer 61, that is, the upper surface 613ba and the side 613bb of the electron injecting layer 613b of the third pattern layer 613, and the encapsulation layer 8 is entirely formed on the second electrode 7. Therefore, the second electrode 7 and the encapsulation layer 8 may serve as passivation films that prevent particles such as water from being permeated into the first organic light emitting layer 61, the second organic light emitting layer 62 and the third organic light emitting layer 63.

In the display device 1 according to one aspect of the present disclosure, advantageous effects may be obtained as follows.

First, in the display device 1 according to one aspect of the present disclosure, as the second pattern layer is provided to cover the upper surface and the side of the first pattern layer, the second pattern layer may serve as a passivation film that protects the first pattern layer. Therefore, the display device 1 according to one aspect of the present disclosure may prevent the first pattern layer from being damaged because the first pattern layer formed earlier is protected from the etching gas that is used when the second pattern layer is formed later.

Second, in the display device 1 according to one aspect of the present disclosure, since the second patter layer including the light emitting layer is patterned by a separate process after the first pattern layer is patterned, the time when the light emitting layer is exposed to the etching gas may be reduced as compared with the case that the first pattern layer and the second pattern layer are patterned at the same time, whereby the light emitting layer may be prevented from being damaged.

Third, in the display device 1 according to one aspect of the present disclosure, as the first pattern layer and the second pattern layer of each organic light emitting layer are spaced apart from each other, the light emitting layers arranged on the subpixel areas adjacent to each other may be prevented from emitting lights, whereby occurrence of a color mixture may be avoided.

Fourth, in the display device 1 according to one aspect of the present disclosure, the third pattern layer of each organic light emitting layer is connected with another third pattern layer and provided as a common layer, whereby the third pattern layer may be provided not only to serve as a passivation film that prevents particles such as water from being permeated into the first pattern layer and the second patter layer but also to reduce a tact time because the number of processes can be reduced without patterning of the third pattern layer separately for each organic light emitting layer.

Fifth, in the display device 1 according to one aspect of the present disclosure, although the first pattern layer, the second pattern layer, and the third pattern layer may be provide as one layer, if at least two or more layers are deposited, the two or more deposited layers are patterned together, whereby the layer arranged at the upper side may protect the upper surface of the layer arranged at the lower side from the etching gas to reduce the damage of the layer arranged at the lower side due to the etching gas.

Figure 3:
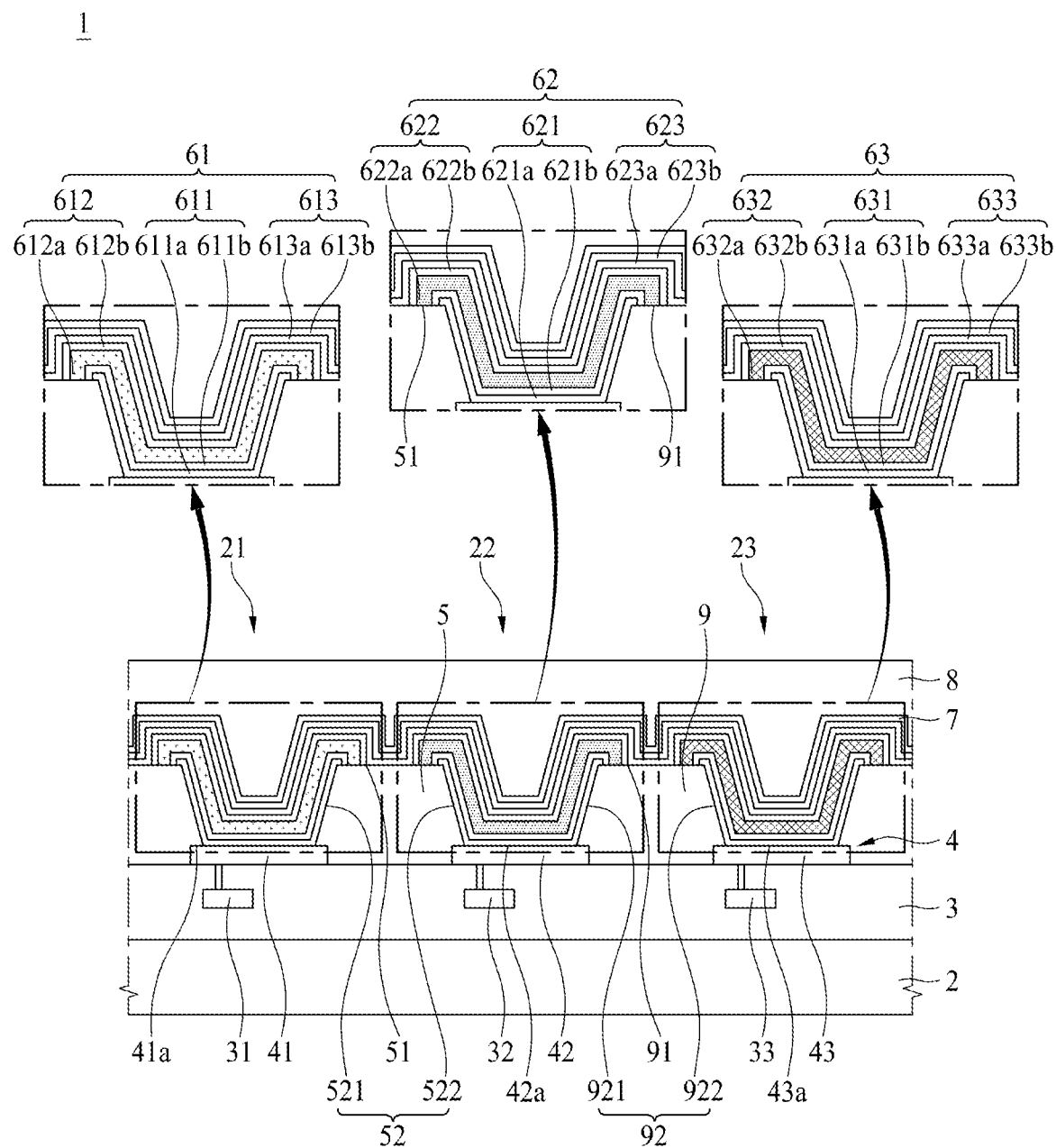
FIG. 3 is a schematic cross-sectional view illustrating a display device according to another aspect of the present disclosure.
Figure 4A:
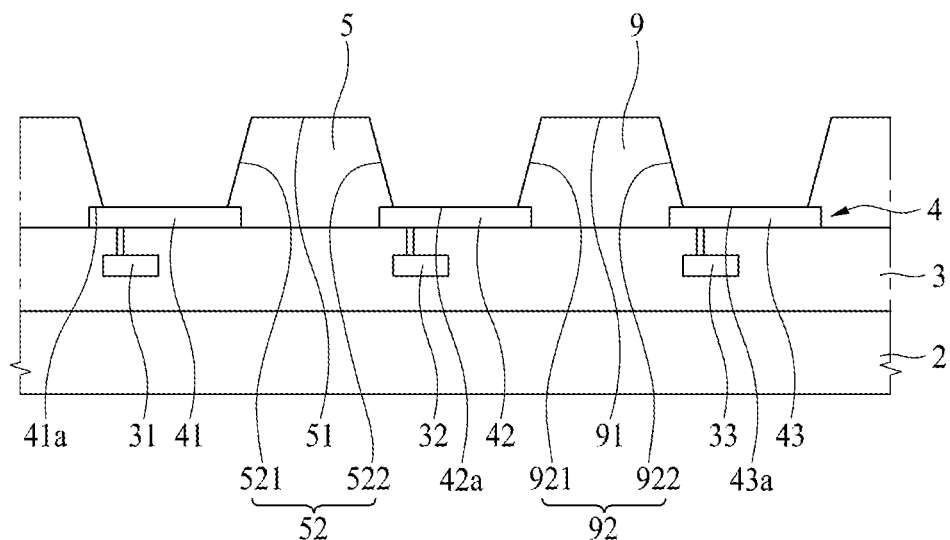
FIGS. 4A to 4P are schematic cross-sectional views illustrating a manufacturing process of a display device according to another aspect of the present disclosure.
Figure 4B:
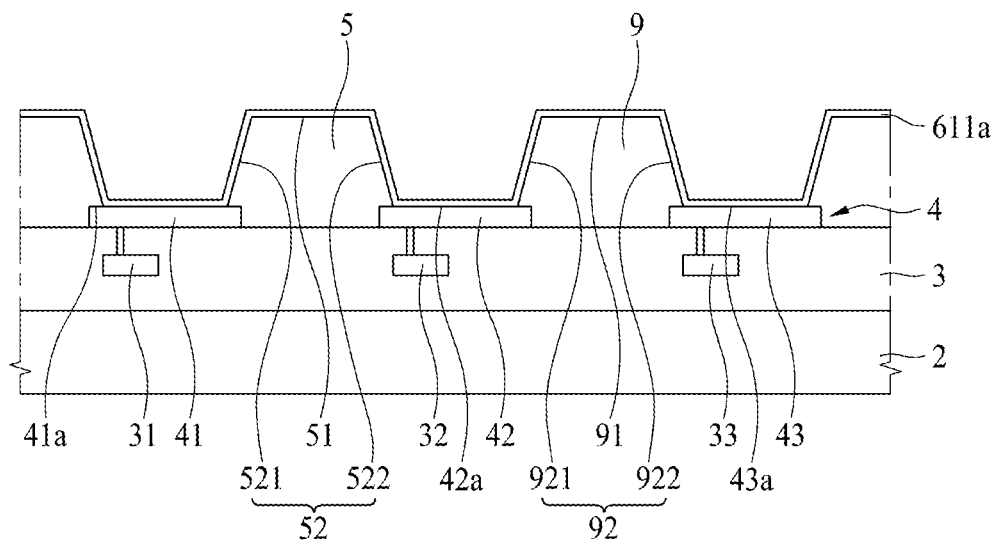
Figure 4C:
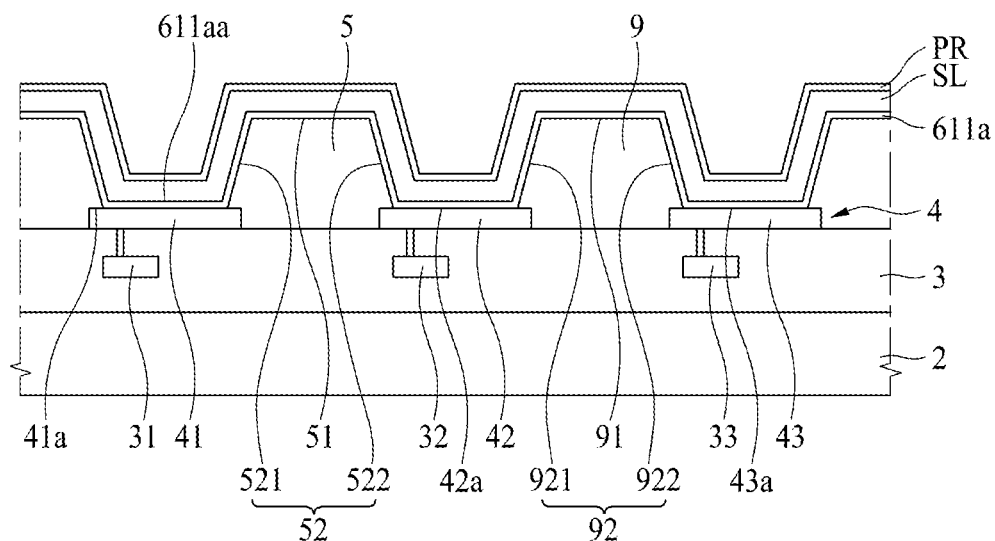
Figure 4D:
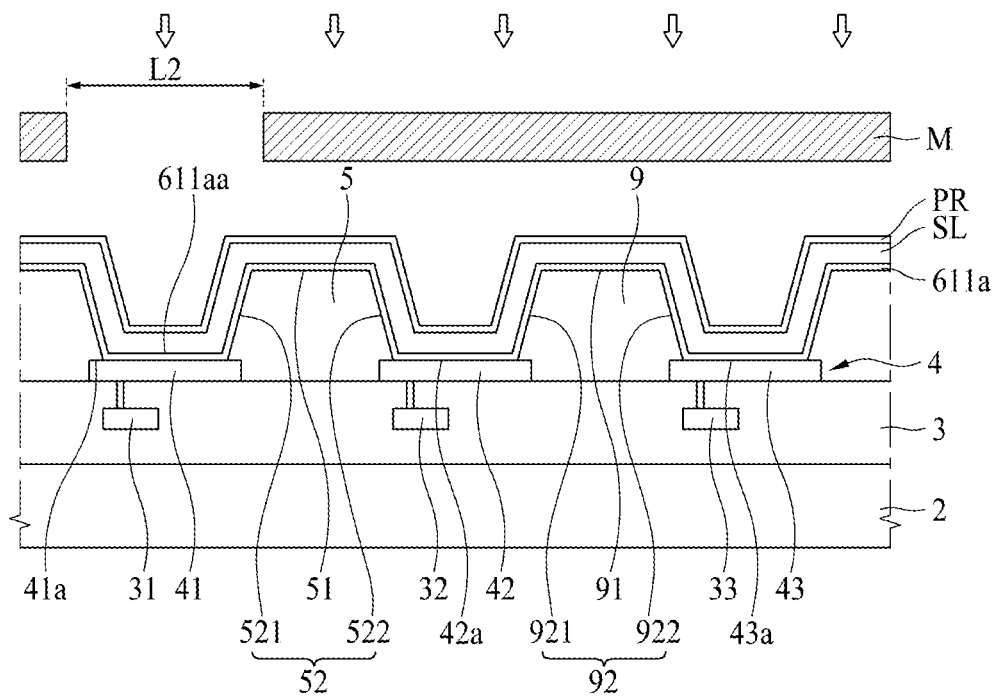
Figure 4E:
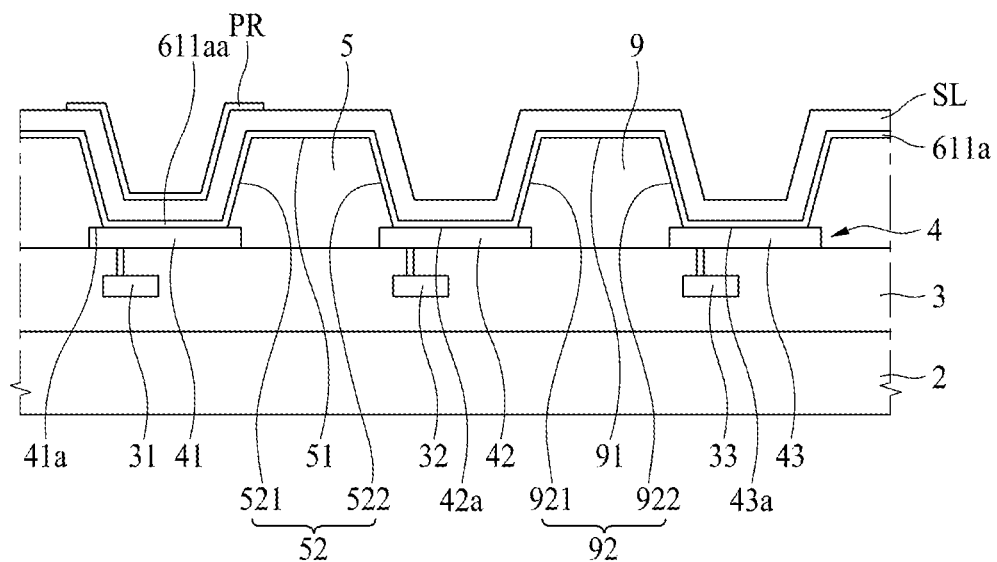
Figure 4F:
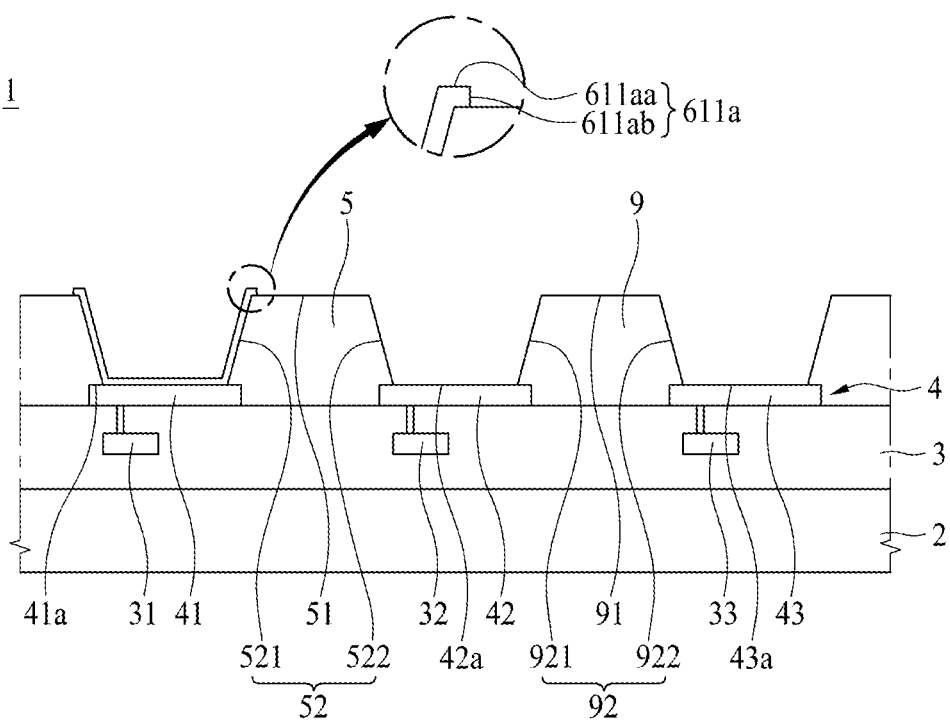
Figure 4G:
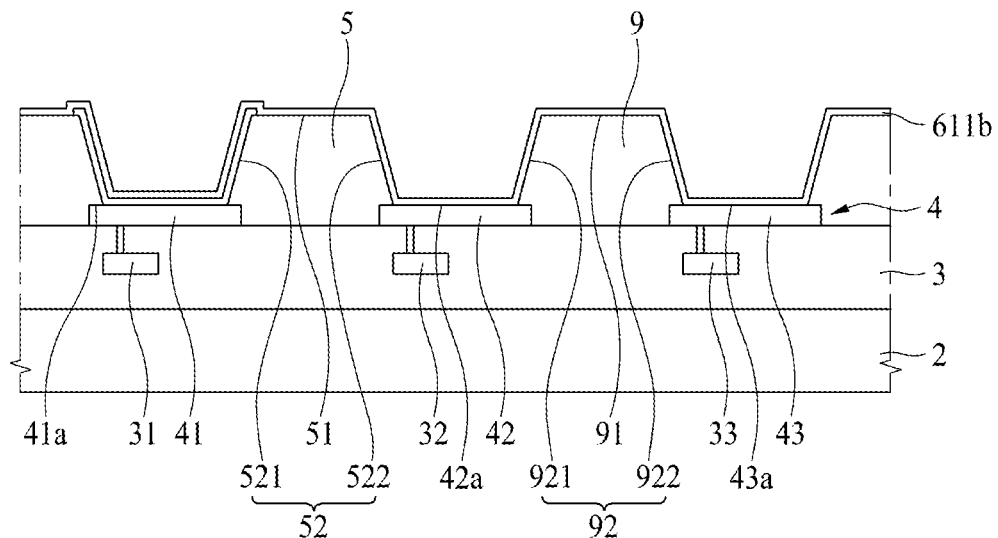
Figure 4H:
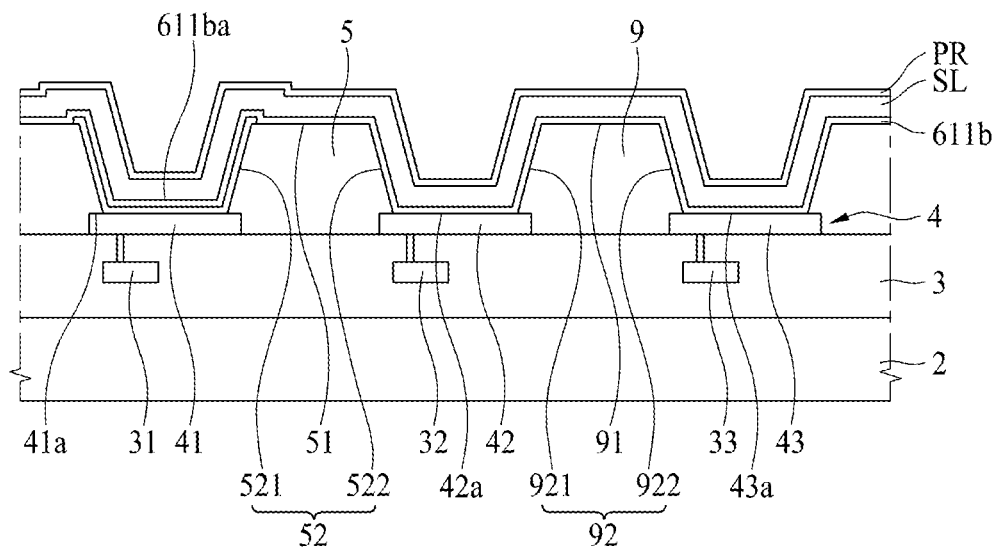
Figure 4I:
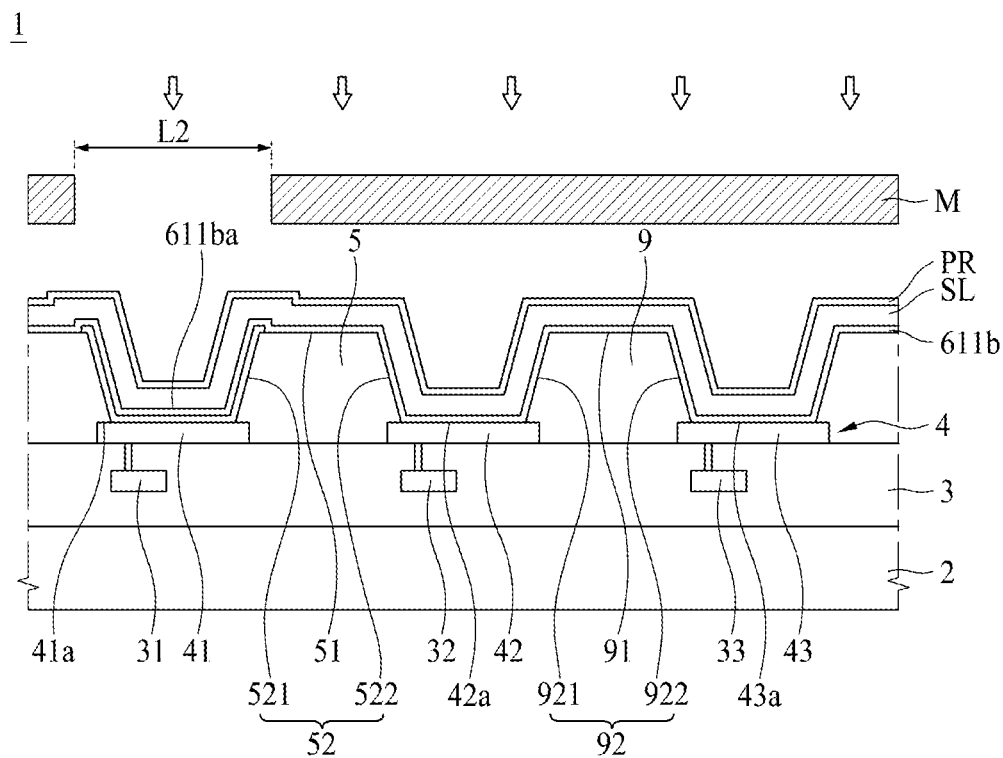
Figure 4J:
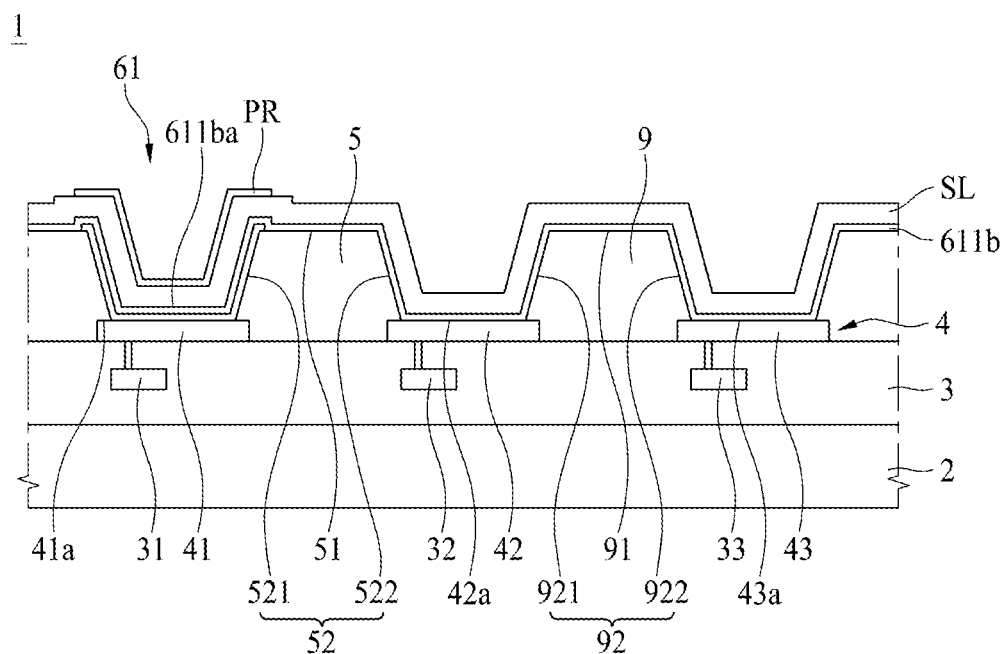
Figure 4K:
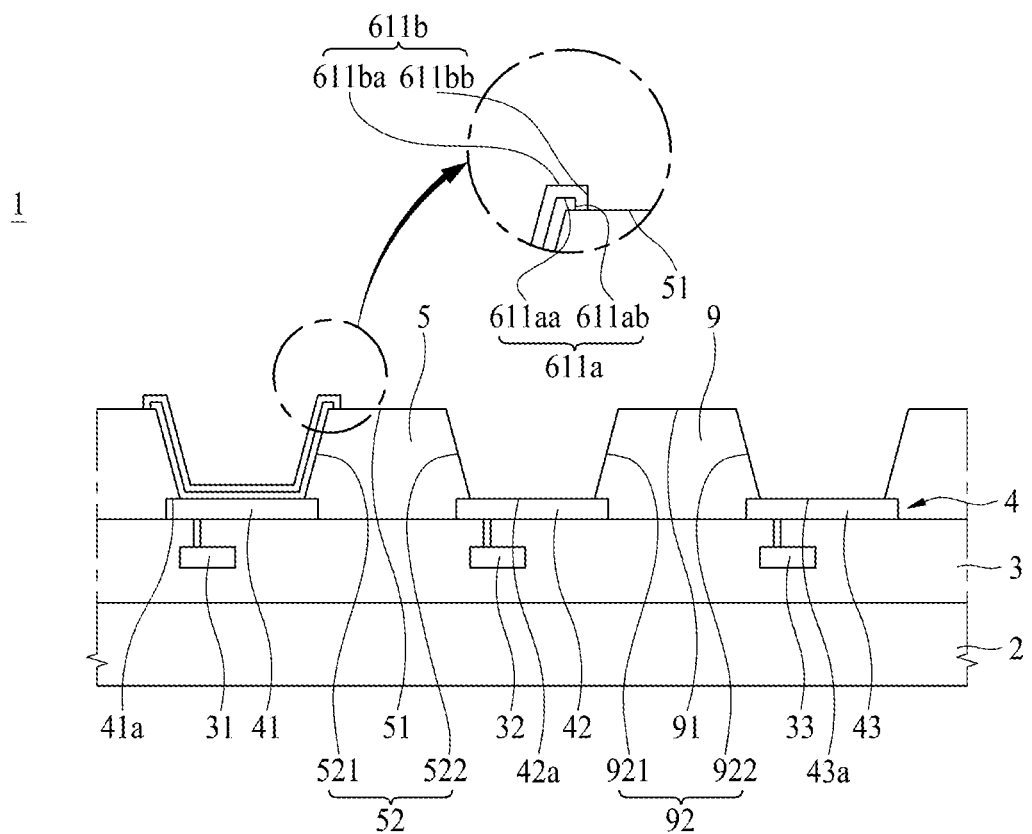
Figure 4L:
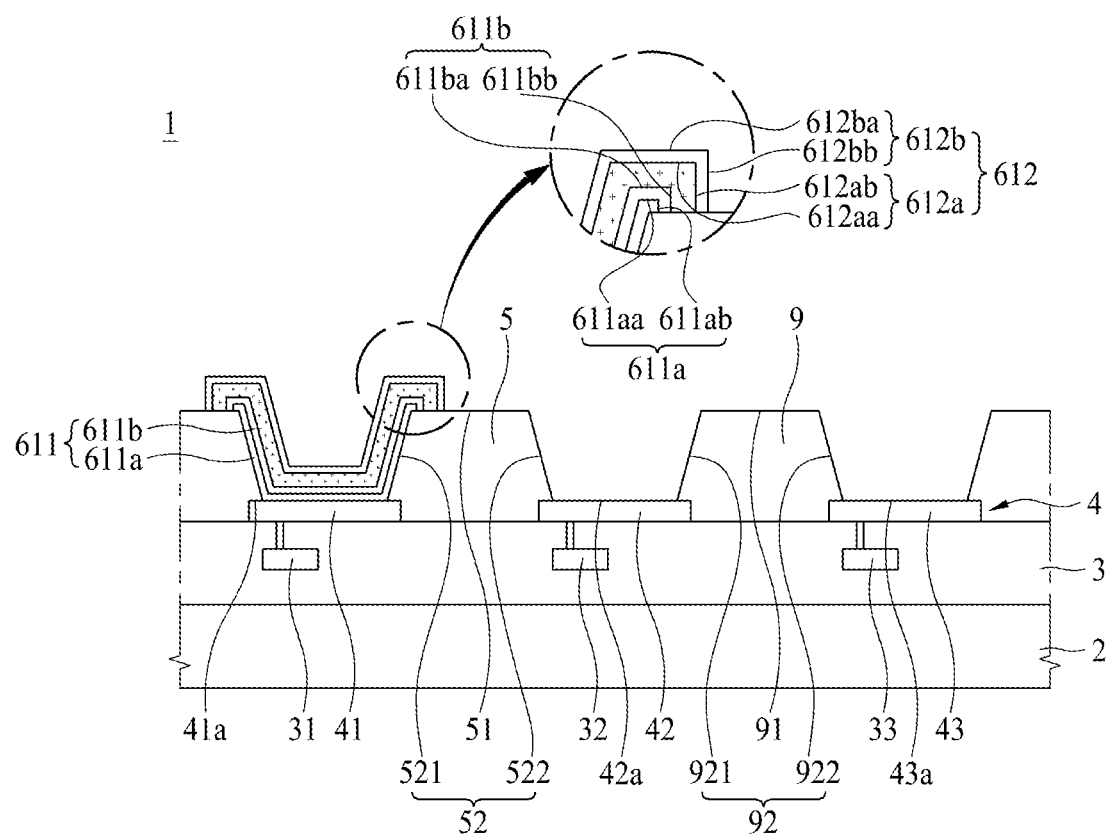
Figure 4M:
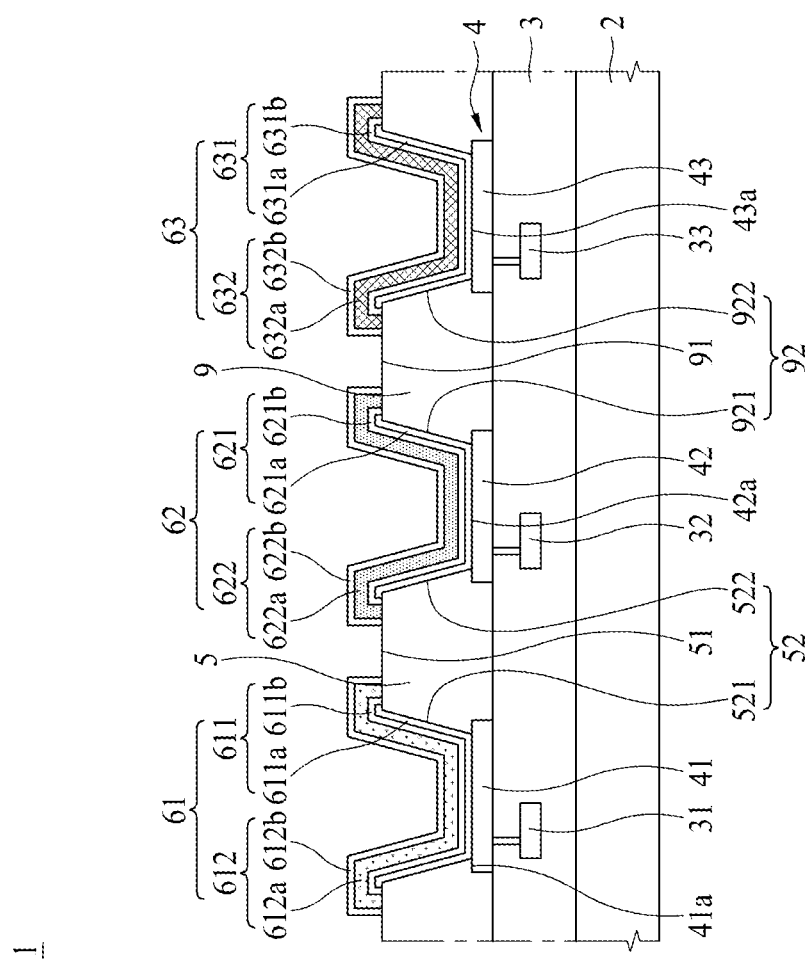
Figure 4N:
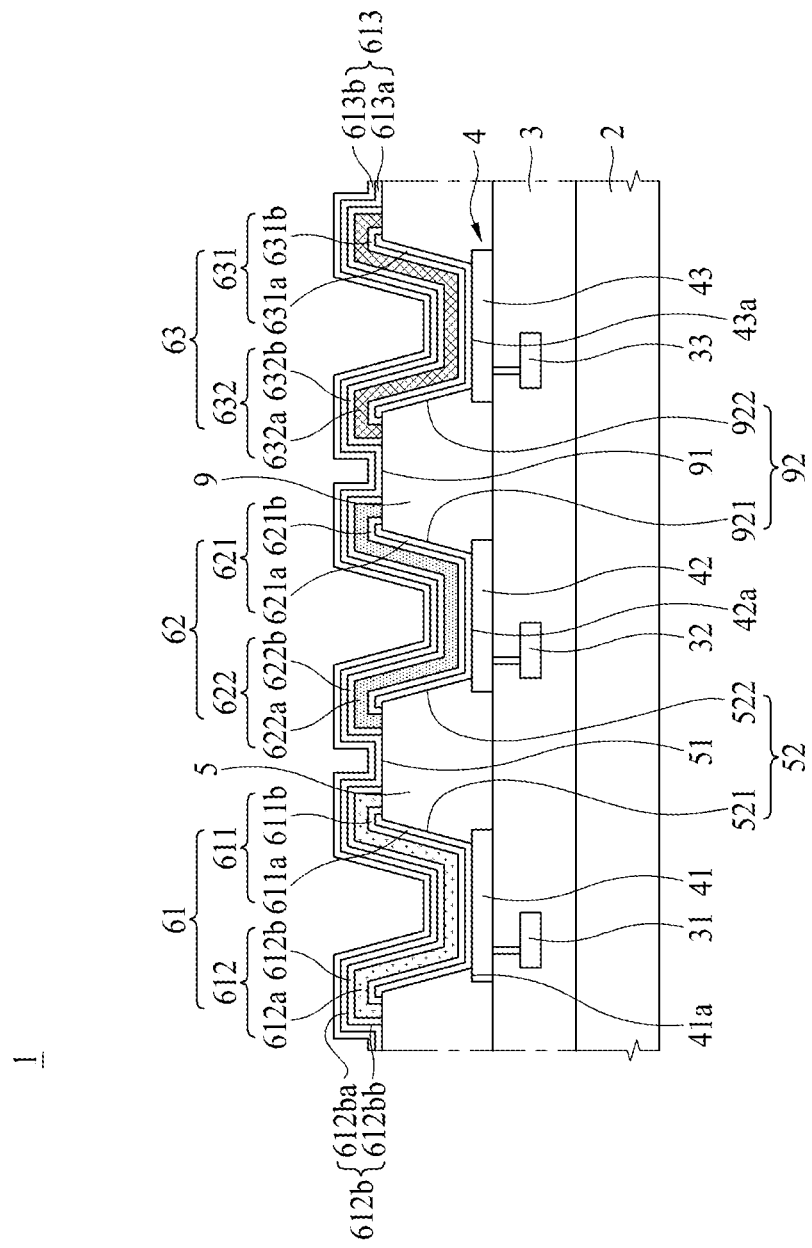
Figure 40:
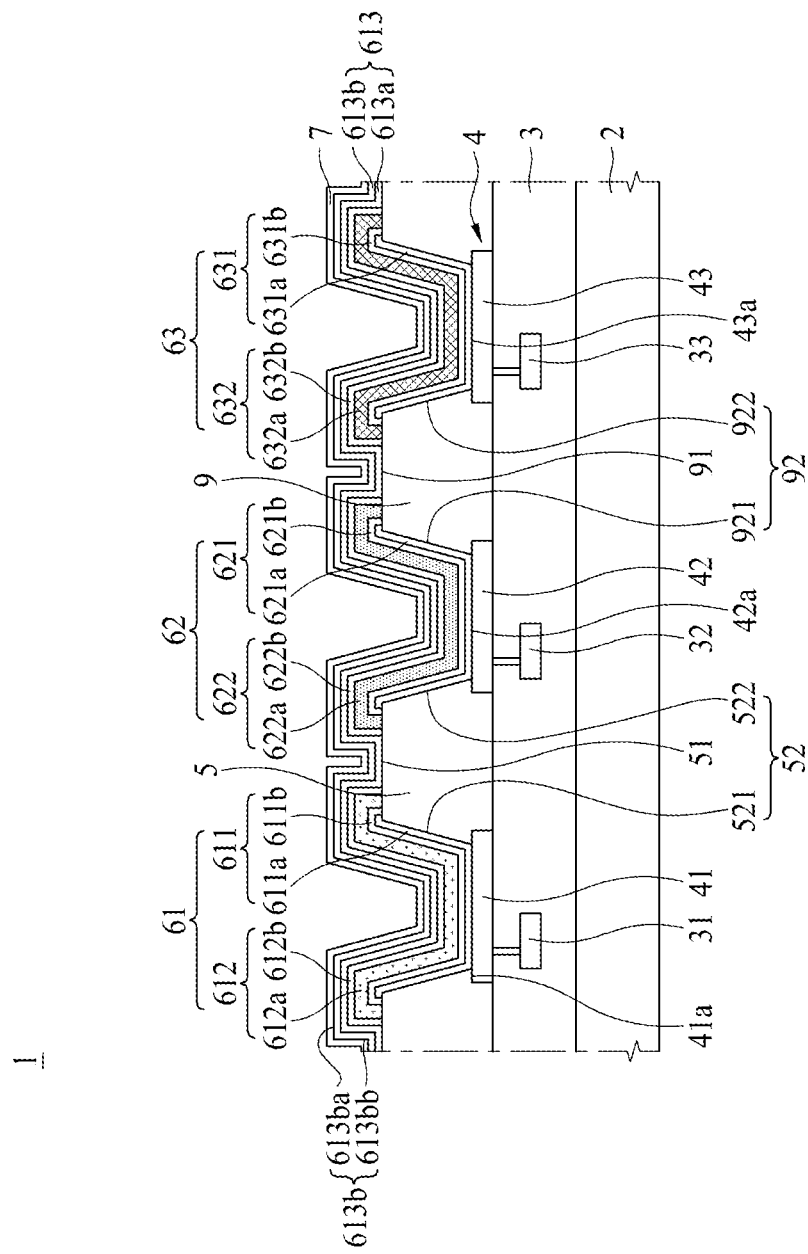
Figure 4P:
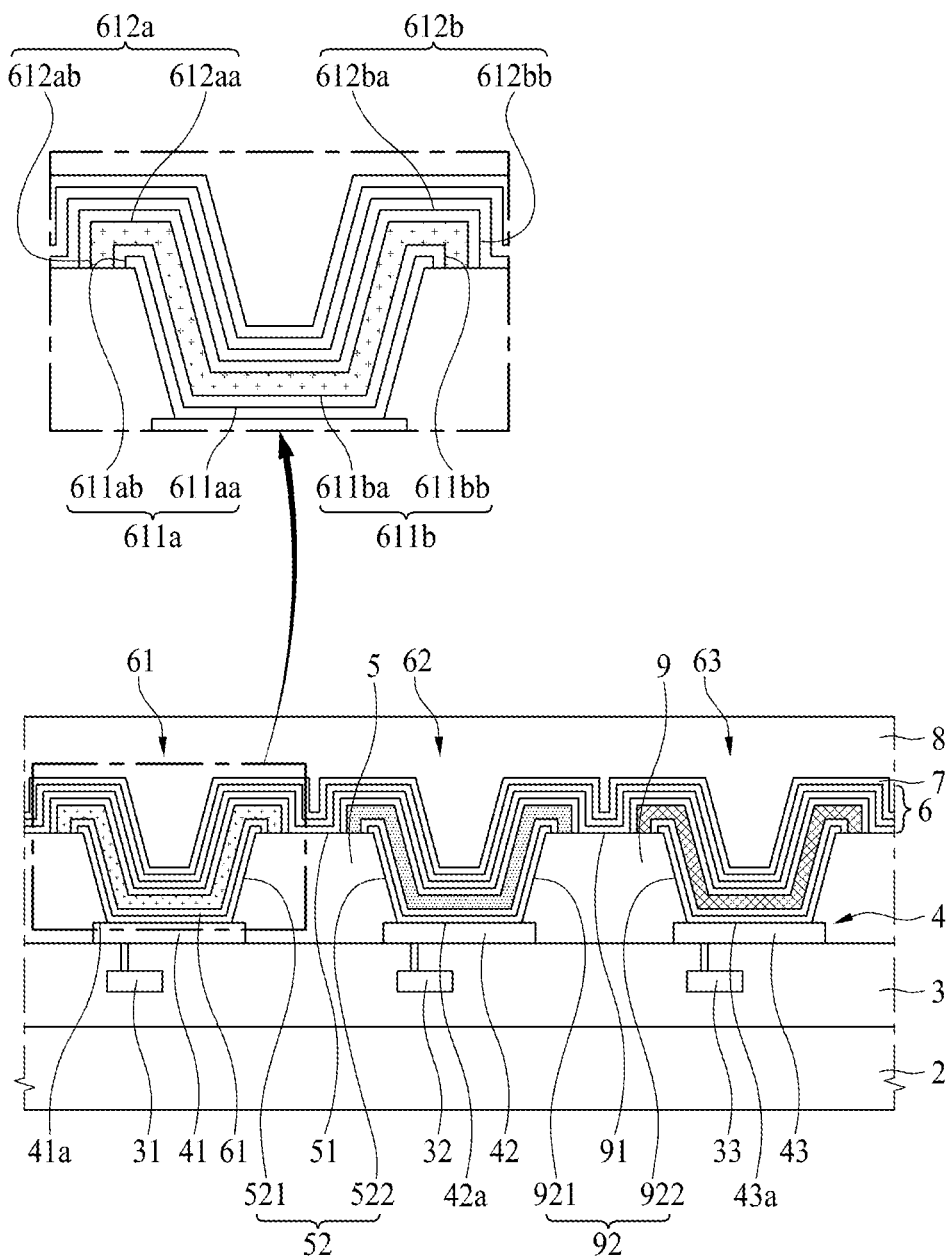

FIG. 3 is a schematic cross-sectional view illustrating a display device according to another aspect of the present disclosure, and FIGS. 4a to 4p are schematic cross-sectional views illustrating a manufacturing process of a display device according to another aspect of the present disclosure.

Referring to FIG. 3 to FIG. 4P, the display device 1 according to another aspect of the present disclosure may comprise a substrate 2, a circuit element layer 3, a first electrode 4, a first bank 5, an organic light emitting layer 6, a second electrode 7, an encapsulation layer 8, and a second bank 9. Since the other elements of the display device 1 according to another aspect of the present disclosure comprised as above are the same as those of the display device 1 according to one aspect of the present disclosure described as above except the structure of the organic light emitting layer 6, their description will be replaced with the aforementioned description.

In more detail, the display device 1 according to another aspect of the present disclosure is the same as the display device 1 according to one aspect of the present disclosure in that the organic light emitting layer 6 is provided with a first organic light emitting layer 61, a second organic light emitting layer 62, and a third organic light emitting layer 63, each of the organic light emitting layers 61, 62 and 63 is provided with a first pattern layer, a second pattern layer, and a third pattern layer, the first pattern layer and the second pattern layer of each of the organic light emitting layers 61, 62, and 63 are spaced apart from each other, the third pattern layer of each of the organic light emitting layers 61, 62, and 63 is connected with another third pattern layer, and the second pattern layer of each of the organic light emitting layers 61, 62 and 63 is provided to cover the upper surface and the side of the first pattern layer.

However, the display device 1 according to another aspect of the present disclosure is different from the display device 1 according to one aspect of the present disclosure in that a plurality of layers constituting each of the first pattern layer and the second pattern layer are not patterned at the same time but patterned separately. Therefore, the plurality of the layers constituting each of the first pattern layer and the second pattern layer of the display device 1 according to another aspect of the present disclosure may be provided in such a manner that the layer patterned later covers the upper surface and the side of the layer patterned earlier.

For example, between the hole injecting layer 611a and the hole transporting layer 611b, which constitute the first pattern layer 611 of the first organic light emitting layer 61, the hole transporting layer 611b patterned later by the etching gas may be provided to cover the upper surface 611aa (shown in FIG. 4K) and the side 611ab (shown in FIG. 4K) of the hole injecting layer 611a patterned earlier by the etching gas. This may equally be applied to the light emitting layer 612a and the hole blocking layer 612b, which constitute the second pattern layer 612 of the first organic light emitting layer 61. That is, the hole blocking layer 612b may be provided to cover the upper surface 612aa (shown in FIG. 4L) and the side 612ab (shown in FIG. 4L) of the light emitting layer 612a. Therefore, among the plurality of the layers constituting the first pattern layer and the second pattern layer of the display device 1 according to another aspect of the present disclosure, the layer formed by being patterned later may seal the layer formed by being patterned earlier and therefore may serve as a passivation film that protects the layer formed by being patterned earlier from particles such as water.

On the other hand, if each of the first pattern layer and the second pattern layer is provided with one layer, the ends of the second pattern layer may be in contact with the upper surface of the bank. In this case, the upper surface of the bank includes not only the upper surface of each of the first bank 5 and the second bank 9 but also the upper surface of each of the banks arranged to cover edges of the plurality of sub electrodes, and the ends of the second pattern layer may mean both ends of the second pattern layer.

For example, referring to FIG. 3, if the first pattern layer 621 of the second organic light emitting layer 62 is provided with only the hole transporting layer 621b and the second pattern layer 622 is provided with only the light emitting layer 622a, the ends of the light emitting layer 622a may be a portion adjoining the upper surface 51 of the first bank 5 and a portion adjoining the upper surface 91 of the second bank 9.

Therefore, in the display device 1 according to another aspect of the present disclosure, the ends of the second pattern layer are in contact with the upper surface of the bank, whereas in the display device 1 according to one aspect of the present disclosure described as above, the ends of the second pattern layer are not in contact with the upper surface of the bank and the lower surface of the second pattern layer is in contact with the upper surface of the bank.

Such a difference may occur because among the plurality of layers constituting each of the first pattern layer and the second pattern layer, two or more layers are patterned at the same time or the plurality of layers are respectively patterned. That is, if the patterning process by exposing the layers to the etching gas is performed by each layer, the display device 1 according to another aspect of the present disclosure in FIG. 3 may be embodied, and if the patterning process is not performed by each layer but performed by two or more layers in a group, the display device 1 according to one aspect of the present disclosure in FIG. 1 may be embodied.

In the display device 1 according to another aspect of the present disclosure, although the number of processes is more increased than the display device 1 according to one aspect of the present disclosure described as above, since the plurality of layers are respectively patterned, the time exposed to the etching gas may be more reduced than the case that two or more layers are patterned in a group, whereby a damage level of each layer damaged by the etching gas may be more reduced.

Hereinafter, the display device 1 according to another aspect of the present disclosure shown in FIG. 3 will be described in more detail with reference to the manufacturing process of the display device 1 according to another aspect of the present disclosure shown in FIGS. 4a to 4p.

First of all, referring to FIGS. 4A to 4D, in a state that the first electrode 4, the first bank 5 and the second bank 9 are formed on the substrate 2 and the circuit element layer 3, after the hole injecting layer 611a of the first pattern layer 611 of the first organic light emitting layer 61 is deposited as a common layer, then a shield layer SL and a PR layer are coated on the hole injecting layer 611a in due order. After-wards, a mask M is arranged such that a hole of a second length L2 is arranged on the area of the first organic light emitting layer 61 and then the PR layer of the portion where the hole is arranged is subjected to exposure. Therefore, property of the exposed PR layer may be changed not to be etched with a developing solution.

In this case, the second length L2 may be equal to or longer than the first length L1. The reason why that the second length L2 should be longer than the first length L1 is that the second length L2 should be provided to be longer than the length of the electron injecting layer last patterned to pattern a plurality of layers constituting the organic light emitting layer, for example, the hole injecting layer, the hole transporting layer, the light emitting layer, the hole blocking layer, the electron transporting layer and the electron injecting layer, which should be patterned separately in the display device 1 according to another aspect of the present disclosure, by using only one mask M. That is, in the display device 1 according to one aspect of the present disclosure described as above, at least two or more of the plurality of layers constituting the first pattern layer may be patterned in a group, thereby matching both ends of the two or more layers with each other. On the other hand, in the display device 1 according to another aspect of the present disclosure, the plurality of layers constituting the first pattern layer are respectively patterned, wherein the layer which is formed later should cover the upper surface and the side of the layer which is formed earlier. Therefore, the first pattern layer becomes longer.

Therefore, in the display device 1 according to another aspect of the present disclosure, the respective layers are sequentially patterned from the hole injecting layer to the electron injecting layer by using only one mask M having a hole of the second length L2, and the time exposed to the etching gas is gradually reduced, whereby it is possible to embody a structure that the layer patterned later covers the upper surface and the side of the layer patterned earlier and adjoins the upper surface of the bank.

Therefore, in the manufacturing method of the display device 1 according to another aspect of the present disclosure, since the plurality of layers constituting the first pattern layer and the second pattern layer of the organic light emitting layer may respectively be patterned using only one mask M having a hole of a second length L2, a plurality of masks M having holes of their respective lengths are not required, whereby the manufacturing cost may be reduced.

Then, referring to FIGS. 4E and 4F, a PR layer of the other area except the first organic light emitting layer 61 is etched with a developing solution and the shield layer SL and the side 611ab of the hole injecting layer 611a are patterned using an etching gas. At this time, the length of the hole injecting layer 611a may be shortened if the time exposed to the etching gas becomes longer.

Meanwhile, in the display device 1 according to another aspect of the present disclosure, as the time when the hole injecting layer 611a is exposed to the etching gas during patterning of the hole injecting layer 611a is too increased, if the hole injecting layer 611a becomes thinner than the thickness originally intended to be manufactured, a process of additionally depositing the hole injecting layer 611a is performed before the hole transporting layer 611b is deposited during next process, whereby the hole injecting layer 611a may be embodied with the thickness originally intended to be manufactured. This may equally be applied to the other layers, which are later formed, as well as the hole injecting layer 611a. Also, this characteristic may equally be applied to even the case that the hole transporting layer arranged above the first pattern layer and the hole blocking layer arranged above the second pattern layer are formed to be thinner than the thickness originally intended to be manufactured in the display device 1 according to one aspect of the present disclosure.

Then, referring to FIGS. 4F to 4I, the hole transporting layer 611*b* is entirely deposited to cover the upper surface 611*aa* and the side 611*ab* of the hole injecting layer 611*a*, and the shield layer SL and the PR layer are coated on the hole transporting layer 611*b* in due order. Afterwards, the mask M is arranged such that a hole having a second length L2 is arranged on the area of the first organic light emitting layer 61, and then the PR layer of the portion where the hole is arranged is subjected to exposure.

Then, referring to FIGS. 4J and 4K, the PR layer of the other area except the first organic light emitting layer 61 is etched with a developing solution and then the shield layer SL and the side 611*bb* of the hole transporting layer 611*b* are patterned using an etching gas. At this time, the time when the hole transporting layer 611*b* is exposed to the etching gas may be shorter than the time when the hole injecting layer 611*a* is exposed to the etching gas. Therefore, since the hole transporting layer 611*b* may be formed to be longer than the hole injecting layer 611*a*, the hole transporting layer 611*b* may cover the upper surface 611*aa* and the side 611*ab* of the hole injecting layer 611*a*, and its end may adjoin the upper surface of the bank.

Then, referring to FIG. 4L, the process of FIGS. 4B to 4F may repeatedly be performed, whereby the light emitting layer 612*a* of the second pattern layer 612 adjoining the upper surface of the bank while covering the upper surface 611*ba* and the side 611*bb* of the hole transporting layer 611*b* of the first pattern layer 611, and the hole blocking layer 612*b* adjoining the upper surface of the bank while covering the upper surface 612*aa* and the side 612*ab* of the light emitting layer 612*a* may be formed.

Then, referring to FIG. 4M, the process of FIGS. 4B to 4L may repeatedly be performed, whereby the first pattern layer 621 and the second pattern layer 622 of the second organic light emitting layer 62, and the first pattern layer 631 and the second pattern layer 632 of the third organic light emitting layer 63 may be formed. At this time, the first pattern layers and the second pattern layers of the organic light emitting layers 61, 62 and 63 may be formed to be spaced apart from each other, whereby a color mixture between the subpixel areas adjacent to each other may be prevented from being generated. Since the first pattern layers and the second pattern layers have been described in the description of the display device 1 according to one aspect of the present disclosure, their detailed description will be omitted.

Then, referring to FIG. 4N, the third pattern layer 613 of the first organic light emitting layer 61 is entirely deposited as a common layer to cover the second pattern layer 612 covering the first pattern layer 611 of the first organic light emitting layer 61, the second pattern layer 622 covering the first pattern layer 621 of the second organic light emitting layer 62, the second pattern layer 632 covering the first pattern layer 631 of the third organic light emitting layer 63, the first bank 5, and the second bank 9. In this case, the third pattern layer 613 of the first organic light emitting layer 61 may be the third pattern layer 623 of the second organic light emitting layer 62 and the third pattern layer 633 of the third organic light emitting layer 63. This case has been described in the description of the display device 1 according to one aspect of the present disclosure and therefore will be omitted.

The third pattern layer 613 of the first organic light emitting layer 61 may be provided to cover the upper surface and the side of the second pattern layer 612. In more detail, the third pattern layer 613 of the first organic light emitting layer 61 may be provided with the electron transporting layer 613*a* and the electron injecting layer 613*b*, and the electron transporting layer 613*a* may be provided to cover the side 612*ba* and the side 612*bb* of the hole blocking layer 612*b* of the second pattern layer 612. Also, the electron transporting layer 613*a* may be provided to cover the upper surface of a plurality of banks. The electron injecting layer 613*b* may be covered to the upper surface of the electron transporting layer 613*a*. Therefore, the second pattern layer 612 of the first organic light emitting layer 61 may be sealed by the third pattern layer 613, and the third pattern layer 613 may prevent particles such as water from being permeated into the second pattern layer 612. Likewise, the second pattern layer 622 of the second organic light emitting layer 62 and the second pattern layer 632 of the third organic light emitting layer 63 may also be sealed by the third pattern layer 613 of the first organic light emitting layer 61.

Consequently, if an electric field is formed between the first electrode 4 and the second electrode 7, the third pattern layer 613 of the first organic light emitting layer 61, the third pattern layer 623 of the second organic light emitting layer 62, and the third pattern layer 633 of the third organic light emitting layer 63 may contribute to light emission together with the first pattern layer and the second pattern layer of each organic light emitting layer, and may serve as passivation films that prevent particles such as water from being permeated into the first pattern layer and the second pattern layer of each organic light emitting layer.

Then, referring to FIGS. 4O and 4P, the second electrode 7 is formed on the entire surface to cover the upper surface and the side of the third pattern layer 613 of the first organic light emitting layer 61, that is, the upper surface 613*ba* and the side 613*bb* of the electron injecting layer 613*b* of the third pattern layer 613, and the encapsulation layer 8 is entirely formed on the second electrode 7. Therefore, the second electrode 7 and the encapsulation layer 8 may serve as passivation films that prevent particles such as water from being permeated into the first organic light emitting layer 61, the second organic light emitting layer 62 and the third organic light emitting layer 63.

In the display device 1 according to another aspect of the present disclosure, advantageous effects may be obtained as follows.

First, in the display device 1 according to another aspect of the present disclosure, among the plurality of layers constituting the first pattern layer, the layer formed by being patterned later is provided to cover the upper surface and the side of the layer formed by being patterned earlier and adjoins the upper surface of the bank, whereby the layer formed later may protect the layer formed earlier to prevent the layer formed earlier from being damaged by the etching gas.

Second, in the display device 1 according to another aspect of the present disclosure, since the plurality of layers constituting the organic light emitting layer are respectively patterned by a separate process, the time exposed to the etching gas may be more reduced than the case that at least two or more layers are patterned in a group, whereby the light emitting layer and each layer other than the light emitting layer may be prevented from being damaged.

Figure 5A:
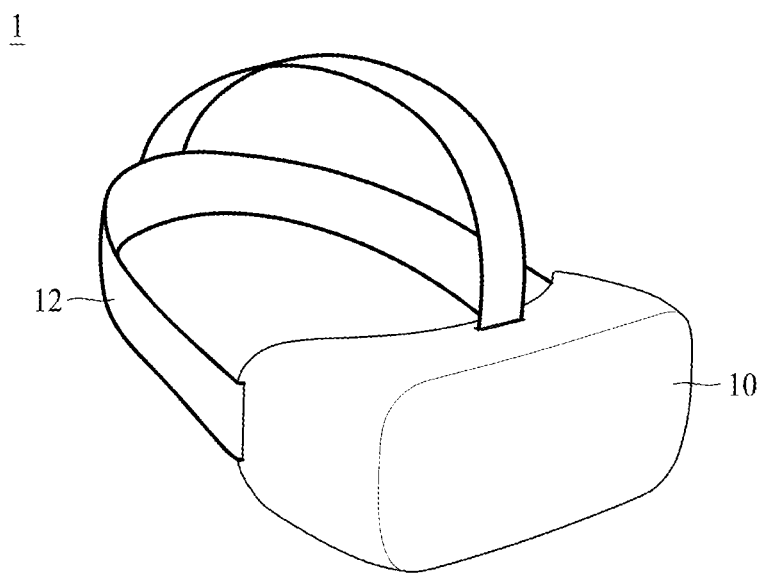
FIGS. 5A to 5C are v schematic views illustrating a display device according to other aspect of the present disclosure, and relate to a head-mounted display (HMD) device.
Figure 5B:
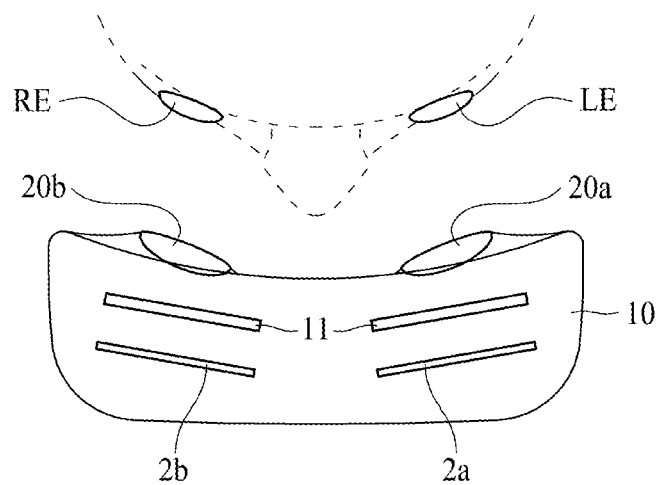
Figure 5C:
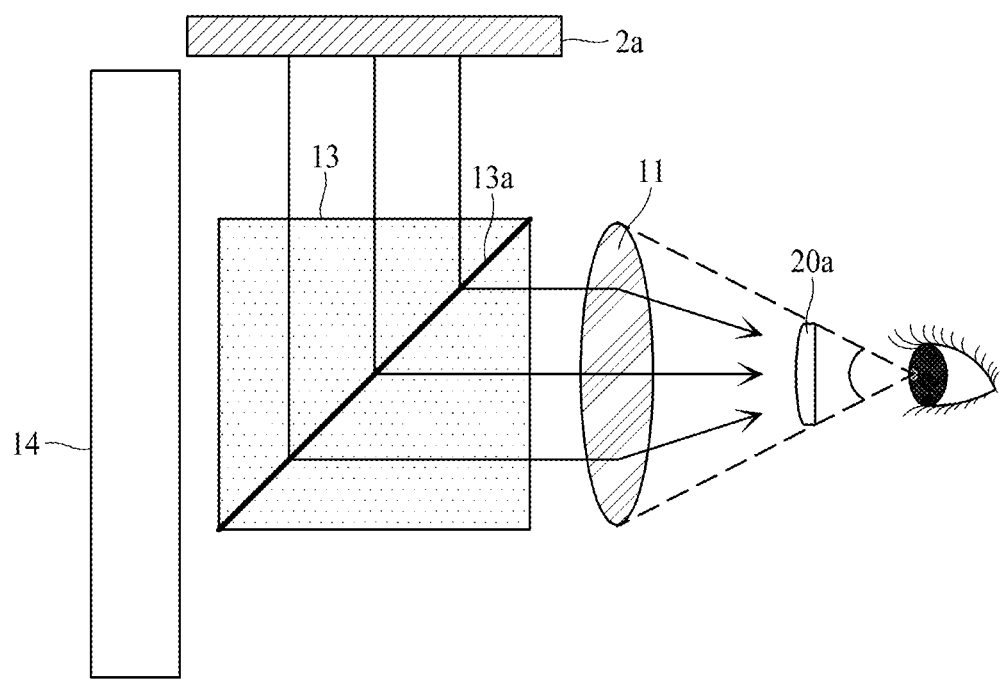

FIGS. 5A to 5C are views illustrating a display device according to other aspect of the present disclosure and relate to a head mounted display (HMD) device. FIG. 5A is schematic perspective view, FIG. 5B is a schematic plane view of a virtual reality (VR) structure, and FIG. 5c is a schematic cross-sectional view of an augmented reality (AR) structure.

As will be aware of it from FIG. 5A, a head mounted display device according to present disclosure comprises a storage case 10 and a head mounted band 12.

The storage case 10 stores elements such as a display device, a lens array, and an ocular lens therein.

The head mounted band 12 is fixed to the storage case 10. The head mounted band 12 is formed to surround an upper surface and both sides of a user's head, but is not limited to this example. The head mounted band 12 is to fix a head mounted display to a user's head and may be replaced with a structure of a shape of a glasses frame or a helmet shape.

As will be aware of it from FIG. 5B, the head mounted display device 1 of a virtual reality (VR) structure according to the present disclosure may include a left eye display device 2a, a right eye display device 2b, a lens array 11, a left eye ocular lens 20a, and a right eye ocular lens 20b.

The left eye display device 2a, the right eye display device 2b, the lens array 11, the left eye ocular lens 20a and the right eye ocular lens 20b are stored in the storage case 10 described above.

The left eye display device 2a and the right eye display device 2b may display the same image, and in this case, a user may view 2D image. Alternatively, the left eye display device 2a may display a left eye image and the right eye display device 2b may display a right eye image, and in this case, a user may view a 3D image. Each of the left eye display device 2a and the right eye display device 2b may be comprised of a display device according to FIGS. 1 to 4p described above. For example, each of the left eye display device 2a and the right eye display device 2b may be an organic light emitting display device.

Each of the left eye display device 2a and the right eye display device 2b may include a plurality of subpixel areas, a circuit element layer 3, a first electrode 4, a first bank 5, an organic light emitting layer 6, a second electrode 7, an encapsulation layer 8, and a second bank 9, and may display various images by combining colors of light emitted from each of the subpixel areas in various manners.

The lens array 11 may be provided between the left eye ocular lens 20a and the left eye display device 2a by being spaced apart from each of the left eye ocular lens 20a and the left eye display device 2a. That is, the lens array 11 may be arranged in front of the left eye ocular lens 20a and behind the left eye display device 2a. Also, the lens array 11 may be provided between the right eye ocular lens 20b and the right eye display device 2b by being spaced apparat from each of the right eye ocular lens 20b and the right eye display device 2b. That is, the lens array 11 may be arranged in front of the right eye ocular lens 20b and behind the right eye display device 2b.

The lens array 11 may be a micro lens array. The lens array 11 may be replaced with a pin hole array. Due to the lens array 11, images displayed on a left eye display device 2a or a right eye display device 2b may be viewed to be magnified to a user.

A left eye LE of a user may be arranged in the left eye ocular lens 20a, and a right eye RE of a user may be arranged in the right eye ocular lens 20b.

As will be aware of it from FIG. 5C, a head mounted display device of an AR structure according to the present disclosure includes a left eye display device 2a, a lens array 11, a left eye ocular lens 20a, a transmissive reflection portion 13, and a transmissive window 14. Although only a structure for a left eye is shown in FIG. 5c for convenience, a structure for a right eye is the same as the structure for the left eye.

The left eye display device 2a, the lens array 11, the left eye ocular lens 20a, the transmissive reflection portion 13, and the transmissive window 14 are stored in the aforementioned storage case 10.

The left eye display device 2a may be arranged at one side of the transmissive reflection portion 13, for example, at an upper side, without covering the transmissive window 14. Therefore, the left eye display device 2a may provide the transmissive reflection portion 13 with an image without covering an outer background viewed through the transmissive window 14.

The left eye display device 2a may be comprised of a display device according to FIGS. 1 to 4P described above. In this case, the top portion corresponding to the surface where images are displayed in FIGS. 1 to 4P, for example, the encapsulation layer 9 or a color filter layer (not shown) faces the transmissive reflection portion 13.

The lens array 11 may be provided between the left eye ocular lens 20a and the transmissive reflection portion 13.

A left eye of a user is arranged in the left eye ocular lens 20a.

The transmissive reflection portion 13 is arranged between the lens array 11 and the transmissive window 14. The transmissive reflection portion 13 may include a reflective surface 13a which transmits a portion of light and reflects another portion of light. The reflective surface 13a is formed to allow an image displayed on the left eye display device 2a to proceed to the lens array 11. Therefore, a user may view all of images displayed on the left eye display device 2a and an outer background through the transmissive window 14. That is, since the user may view one image by overlapping background in reality with virtual images, augmented reality (AR) may be embodied.

The transmissive window 14 is arranged in front of the transmissive reflection portion 13.

It will be apparent to those skilled in the art that the present disclosure described above is not limited by the above-described aspects and the accompanying drawings and that various substitutions, modifications, and variations can be made in the present disclosure without departing from the spirit or scope of the disclosures. Consequently, the scope of the present disclosure is defined by the accompanying claims, and it is intended that all variations or modifications derived from the meaning, scope, and equivalent concept of the claims fall within the scope of the present disclosure.

What is claimed is:

1. A display device comprising:
    a substrate provided with a first subpixel area and a second subpixel area;
    a first electrode provided on the substrate, and including a first sub electrode provided on the first subpixel area and a second sub electrode provided on the second subpixel area;
    an organic light emitting layer including a first organic light emitting layer arranged on the first sub electrode and a second organic light emitting layer arranged on the second sub electrode;
    a second electrode arranged on the organic light emitting layer; and
    a first bank provided between the first sub electrode and the second sub electrode and partitioning the first subpixel area and the second subpixel area from each other, wherein the first organic light emitting layer includes a first pattern layer, a second pattern layer provided on the first pattern layer and a third pattern layer provided on the second pattern layer, wherein the second organic light emitting layer includes a first pattern layer, a second pattern layer provided on the first pattern layer and a third pattern layer provided on the second pattern layer, wherein the third pattern layer of the first organic light emitting layer is connected with the third pattern layer of the second organic light emitting layer, wherein the second pattern layer of the first organic light emitting layer is provided to cover an upper surface and a side of the first pattern layer of the first organic light emitting layer, and wherein the first pattern layer and the second pattern layer of the first organic light emitting layer and the first pattern layer and the second pattern layer of the second organic light emitting layer are arranged on an upper surface of the first bank, the first pattern layer of the first organic light emitting layer and the first pattern layer of the second organic light emitting layer are spaced apart from each other on the upper surface of the first bank and the second pattern layer of the first organic light emitting layer and the second pattern layer of the second organic light emitting layer are spaced apart from each other on the upper surface of the first bank.

2. The display device of claim 1, wherein the first pattern layer of the first and second organic light emitting layers includes a hole injecting layer and a hole transporting layer provided on the hole injecting layer, and both ends of the hole injecting layer and the hole transporting layer match each other.

3. The display device of claim 1, wherein the first pattern layer of the first and second organic light emitting layers includes a hole injecting layer and a hole transporting layer provided on the hole injecting layer, and the hole transporting layer is provided to cover an upper surface and a side of the hole injecting layer.

4. The display device of claim 1, wherein the second pattern layer of the first and second organic light emitting layers includes a light emitting layer and a hole blocking layer provided on the light emitting layer, and both ends of the light emitting layer and the hole blocking layer match each other.

5. The display device of claim 1, wherein the second pattern layer of the first and second organic light emitting layers includes a light emitting layer and a hole blocking layer provided on the light emitting layer, and the hole blocking layer is provided to cover an upper surface and a side of the light emitting layer.

6. The display device of claim 1, wherein the third pattern layer of the first and second organic light emitting layers is provided to respectively cover an upper surface and a side of the second pattern layer of the first and second organic light emitting layers.

7. The display device of claim 6, wherein the third pattern layer of the first and second organic light emitting layers includes an electron transporting layer provided to cover the upper surface and the side of the second pattern layer of the first and second organic light emitting layers respectively, and an electron injecting layer provided to cover an upper surface and a side of the electron transporting layer.

8. The display device of claim 6, wherein the third pattern layer of the first and second organic light emitting layers includes an electron transporting layer provided to respectively cover an upper surface and the side of the second pattern layer of the first and second organic light emitting layers, and an electron injecting layer provided to cover an upper surface and a side of the electron transporting layer, and the electron transporting layer and the electron injecting layer are provided with a same pattern.

9. A display device comprising:
a substrate provided with a first subpixel area and a second subpixel area;
a first electrode provided on the substrate, and including a first sub electrode provided on the first subpixel area and a second sub electrode provided on the second subpixel area;
an organic light emitting layer including a first organic light emitting layer arranged on the first sub electrode and a second organic light emitting layer arranged on the second sub electrode;
a second electrode arranged on the organic light emitting layer;
a first bank provided between the first sub electrode and the second sub electrode, partitioning the first subpixel area from the second subpixel area; and
a second bank provided between the second sub electrode and the third sub electrode, partitioning the second subpixel area from the third subpixel area,
wherein the first organic light emitting layer includes a first pattern layer, a second pattern layer provided on the first pattern layer and a third pattern layer provided on the second pattern layer,
wherein the second organic light emitting layer includes a first pattern layer, a second pattern layer provided on the first pattern layer and a third pattern layer provided on the second pattern layer,
wherein the first pattern layer of the first organic light emitting layer is spaced apart from the first pattern layer of the second organic light emitting layer, the second pattern layer of the first organic light emitting layer is spaced apart from the second pattern layer of the second organic light emitting layer, and the third pattern layer of the first organic light emitting layer is connected with the third pattern layer of the second organic light emitting layer, and
wherein the second pattern layer of the first organic light emitting layer is provided to cover an upper surface and a side of the first pattern layer of the first organic light emitting layer,
wherein the substrate includes a third subpixel area adjacent to one side of the first subpixel area or the second subpixel area, the first electrode includes a third sub electrode provided on the substrate and provided in the third subpixel area, the organic light emitting layer includes a third organic light emitting layer arranged on the third sub electrode, and the first organic light emitting layer,
wherein each of the second organic light emitting layer and the third organic light emitting layer emits red (R) light, green (G) light and blue (B) light,
wherein the third organic light emitting layer includes a first pattern layer, a second pattern layer provided on the first pattern layer and a third pattern layer provided on the second pattern layer, and
wherein the third pattern layer of the first organic light emitting layer, the third pattern layer of the second organic light emitting layer and the third pattern layer of the third organic light emitting layer are connected with one another and provided to cover the first bank and the second bank.

10. A display device comprising:
a substrate provided with a first subpixel area and a second subpixel area;
a first electrode provided on the substrate;
a bank provided to cover ends of the first electrode and partitioning the first subpixel area and the second subpixel area from each other;
an organic light emitting layer including a first organic light emitting layer arranged on the first sub electrode of the first subpixel area and a second organic light emitting layer arranged on the first sub electrode of the second subpixel area; and
a second electrode arranged on the organic light emitting layer,
wherein the first organic light emitting layer includes a first pattern layer and a second pattern layer provided on the first pattern layer, the second organic light emitting layer includes a first pattern layer and a second pattern layer provided on the first pattern layer, the second pattern layer of the first organic light emitting layer is in contact with each of an upper surface and a side surface of the first pattern layer of the first organic light emitting layer so as to cover the upper surface and the side surface of the first pattern layer of the first organic light emitting layer, and the second pattern layer of the second organic light emitting layer is in contact with each of an upper surface and a side surface of the first pattern layer of the second organic light emitting layer so as to cover the upper surface and the side of the first pattern layer of the second organic light emitting layer, and
wherein the first pattern layer and the second pattern layer of the first organic light emitting layer and the first pattern layer and the second pattern layer of the second organic light emitting layer are arranged on an upper surface of the bank, and on the upper surface of the bank, the first pattern layer of the first organic light emitting layer and the first pattern layer of the second organic light emitting layer are spaced apart from each other and the second pattern layer of the first organic light emitting layer and the second pattern layer of the second organic light emitting layer are spaced apart from each other.

11. The display device of claim 10, wherein ends of the second pattern layer of each of the first organic light emitting layer and the second organic light emitting layer are in contact with an upper surface of the bank.

12. The display device of claim 11, further comprising a lens array spaced apart from the substrate and a storage case storing the substrate and the lens array.

13. A head mounted display device comprising:
a left eye display device and a right eye display device, each comprising:
a substrate provided with a first subpixel area and a second subpixel area;
a first electrode provided on the substrate;
a bank provided to cover ends of the first electrode and partitioning the first subpixel area and the second subpixel area from each other;
an organic light emitting layer including a first organic light emitting layer arranged on the first sub electrode of the first subpixel area and a second organic light emitting layer arranged on the first sub electrode of the second subpixel area;
a second electrode arranged on the organic light emitting layer;
a lens array spaced apart from the substrate and a storage case storing the substrate and the lens array;
wherein the first organic light emitting layer includes a first pattern layer and a second pattern layer provided on the first pattern layer, the second organic light emitting layer includes a first pattern layer and a second pattern layer provided on the first pattern layer, the second pattern layer of the first organic light emitting layer is in contact with each of an upper surface and a side surface of the first pattern layer of the first organic light emitting layer so as to cover the upper surface and the side surface of the first pattern layer of the first organic light emitting layer, and the second pattern layer of the second organic light emitting layer is in contact with each of an upper surface and a side surface of the first pattern layer of the second organic light emitting layer so as to cover the upper surface and the side surface of the first pattern layer of the second organic light emitting layer, and
wherein the first pattern layer and the second pattern layer of the first organic light emitting layer and the first pattern layer and the second pattern layer of the second organic light emitting layer are arranged on an upper surface of the bank, and on the upper surface of the bank, the first pattern layer of the first organic light emitting layer and the first pattern layer of the second organic light emitting layer are spaced apart from each other and the second pattern layer of the first organic light emitting layer and the second pattern layer of the second organic light emitting layer are spaced apart from each other.

14. The display device of claim 13, wherein ends of the second pattern layer of each of the first organic light emitting layer and the second organic light emitting layer are in contact with an upper surface of the bank.

* * * * *